(12) United States Patent
Shin

(10) Patent No.: US 10,665,544 B2
(45) Date of Patent: May 26, 2020

(54) SEMICONDUCTOR DEVICE INCLUDING CONDUCTIVE PATTERNS

(71) Applicant: SAMSUNG ELECTRONICS CO., LTD., Suwon-si, Gyeonggi-Do (KR)

(72) Inventor: Seok-Ho Shin, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/100,333

(22) Filed: Aug. 10, 2018

(65) Prior Publication Data

US 2019/0214345 A1   Jul. 11, 2019

(30) Foreign Application Priority Data

Jan. 8, 2018   (KR) .................. 10-2018-0002069

(51) Int. Cl.
| | |
|---|---|
| *H01L 23/532* | (2006.01) |
| *H01L 27/11* | (2006.01) |
| *H01L 21/033* | (2006.01) |
| *H01L 21/768* | (2006.01) |
| *H01L 49/02* | (2006.01) |
| *H01L 29/08* | (2006.01) |
| *H01L 27/11517* | (2017.01) |
| *H01L 29/06* | (2006.01) |
| *H01L 27/108* | (2006.01) |

(52) U.S. Cl.
CPC ...... *H01L 23/5329* (2013.01); *H01L 21/0337* (2013.01); *H01L 21/76897* (2013.01); *H01L 27/10814* (2013.01); *H01L 27/10852* (2013.01); *H01L 27/10885* (2013.01); *H01L 27/10888* (2013.01); *H01L 27/11517* (2013.01); *H01L 28/40* (2013.01); *H01L 28/90* (2013.01); *H01L 29/0649* (2013.01); *H01L 29/0843* (2013.01)

(58) Field of Classification Search
CPC . H01L 23/5329; H01L 27/11517; H01L 28/40
See application file for complete search history.

(56) References Cited

U.S. PATENT DOCUMENTS 5,792,687 A * 8/1998 Jeng .................. H01L 27/10852
257/E21.648
5,828,130 A * 10/1998 Miller ............... H01L 21/28525
257/754

(Continued)

FOREIGN PATENT DOCUMENTS

KR    1020100037406    4/2010

*Primary Examiner* — Ida M Soward
(74) *Attorney, Agent, or Firm* — F. Chau & Associates, LLC

(57) ABSTRACT

A semiconductor device includes a substrate including first and second regions, which are arranged along a first direction. A first conductive pattern extends in the first direction in the first region. A second conductive pattern extends in the first direction in the first region. The second conductive pattern is spaced apart from the first conductive pattern. A first spacer extends between the first conductive pattern and the second conductive pattern along a sidewall of the first conductive pattern, a sidewall of the second conductive pattern, and a boundary between the first and second regions. A distance between the first conductive pattern and the second region is smaller than a distance between the second conductive pattern and the second region.

20 Claims, 35 Drawing Sheets

(56) References Cited

U.S. PATENT DOCUMENTS

| | | | |
|---|---|---|---|
| 6,403,419 B1* | 6/2002 | Kim | H01L 27/11521 |
| | | | 257/E21.422 |
| 6,731,008 B1* | 5/2004 | Tomita | H01L 21/76897 |
| | | | 257/296 |
| 7,785,959 B2* | 8/2010 | Cheng | G11C 8/16 |
| | | | 257/302 |
| 8,154,076 B2* | 4/2012 | Takaishi | H01L 21/823487 |
| | | | 257/331 |
| 8,344,517 B2* | 1/2013 | Kim | H01L 21/7682 |
| | | | 257/774 |
| 8,368,182 B2 | 2/2013 | Lee et al. | |
| 8,390,051 B2 | 3/2013 | Bicksler | |
| 8,502,322 B2 | 8/2013 | Nitta | |
| 8,541,306 B2 | 9/2013 | Yang et al. | |
| 8,590,034 B2 | 11/2013 | Hussain et al. | |
| 8,629,494 B2* | 1/2014 | Kim | H01L 27/105 |
| | | | 257/334 |
| 8,674,522 B1 | 3/2014 | Pratt et al. | |
| 8,697,525 B2* | 4/2014 | Kim | H01L 21/7682 |
| | | | 438/294 |
| 8,728,940 B2 | 5/2014 | Pellizzer et al. | |
| 8,742,529 B2 | 6/2014 | Sugimae et al. | |
| 8,872,272 B2* | 10/2014 | Flachowsky | H01L 21/823807 |
| | | | 257/369 |
| 8,941,157 B2* | 1/2015 | Kim | H01L 21/7682 |
| | | | 257/288 |
| 8,987,106 B2* | 3/2015 | Shima | H01L 21/823412 |
| | | | 438/306 |
| 9,337,151 B2* | 5/2016 | Park | H01L 23/535 |
| 9,356,028 B2* | 5/2016 | Burgess | H01L 21/76897 |
| 9,356,071 B2 | 5/2016 | Seo et al. | |
| 9,472,617 B2* | 10/2016 | Jang | H01L 29/0653 |
| 9,590,034 B2 | 3/2017 | Shin et al. | |
| 10,141,200 B2* | 11/2018 | Byun | H01L 21/28132 |
| 2002/0081799 A1* | 6/2002 | Kim | H01L 27/105 |
| | | | 438/233 |
| 2008/0017915 A1* | 1/2008 | Kwon | H01L 27/105 |
| | | | 257/316 |
| 2009/0296477 A1* | 12/2009 | Kim | H01L 27/11521 |
| | | | 365/185.17 |
| 2011/0076846 A1* | 3/2011 | Lee | H01L 21/76897 |
| | | | 438/667 |
| 2014/0061796 A1* | 3/2014 | Chang | H01L 21/845 |
| | | | 257/347 |
| 2014/0264479 A1* | 9/2014 | Cai | H01L 29/401 |
| | | | 257/288 |
| 2016/0197003 A1* | 7/2016 | Kim | H01L 21/76855 |
| | | | 438/655 |
| 2017/0154809 A1 | 6/2017 | Kim | |
| 2017/0278848 A1* | 9/2017 | Wu | H01L 27/10814 |
| 2018/0047746 A1* | 2/2018 | Shinohara | H01L 27/11568 |

* cited by examiner

SEMICONDUCTOR DEVICE INCLUDING CONDUCTIVE PATTERNS

CROSS-REFERENCE TO RELATED APPLICATION

This application claims priority under 35 USC § 119 to Korean Patent Application No. 10-2018-0002069, filed on Jan. 8, 2018, the disclosure of which is incorporated by reference herein in its entirety.

1. Technical Field

Exemplary embodiments of the present inventive concept relate to a semiconductor device, and more particularly, to a semiconductor device including conductive patterns and a method of fabricating the same.

2. Discussion of Related Art

Semiconductor devices may be relatively highly integrated, and thus semiconductor patterns in semiconductor devices may be relatively highly integrated. Each individual semiconductor device may be relatively small. Thus, the width of, and the pitch between, such patterns, may be relatively small.

SUMMARY

Exemplary embodiments of the present inventive concept provide a semiconductor device with an increased process margin.

Exemplary embodiments of the present inventive concept provide a method of fabricating a semiconductor device with an increased process margin.

According to an exemplary embodiment of the present inventive concept, a semiconductor device includes a substrate including first and second regions, which are arranged along a first direction. A first conductive pattern extends in the first direction in the first region. A second conductive pattern extends in the first direction in the first region. The second conductive pattern is spaced apart from the first conductive pattern. A first spacer extends between the first conductive pattern and the second conductive pattern along a sidewall of the first conductive pattern, a sidewall of the second conductive pattern, and a boundary between the first and second regions. A distance between the first conductive pattern and the second region is smaller than a distance between the second conductive pattern and the second region.

According to an exemplary embodiment of the present inventive concept, a semiconductor device includes an insulating structure disposed on a substrate and including a first protruding portion, which protrudes in a first direction that is parallel to a top surface of the substrate. The insulating structure includes a second protruding portion, which is spaced apart from the first protruding portion and protrudes in the first direction. A first conductive pattern extends from an end of the first protruding portion in the first direction on the substrate. A second conductive pattern extends from an end of the second protruding portion in the first direction on the substrate. A first spacer extends between the first conductive pattern and the second conductive pattern along a sidewall of the insulating structure, a sidewall of the first conductive pattern, and a sidewall of the second conductive pattern. A length by which the first protruding portion extends in the first direction differs from a length by which the second protruding portion extends in the first direction.

According to an exemplary embodiment of the present inventive concept, a semiconductor device includes a substrate including first and second regions, which are arranged along a first direction, and a plurality of active regions, which are disposed in the first region. A first conductive pattern extends in the first direction in the first region. A second conductive pattern extends in the first direction in the first region. The second conductive pattern is spaced apart from the first conductive pattern. A direct contact is electrically connected to the first conductive pattern. A distance between the first conductive pattern and the second region is smaller than a distance between the second conductive pattern and the second region. At least a part of the second conductive pattern overlaps with the direct contact in a second direction, which intersects the first direction.

According to an exemplary embodiment of the present inventive concept, a semiconductor device includes a substrate and a first conductive pattern disposed on the substrate. A second conductive pattern is disposed on the substrate. The second conductive pattern extends in parallel with the first conductive pattern. A length of the first conductive pattern is different from a length of the second conductive pattern. An insulating structure includes a first protruding portion and a second protruding portion. A sidewall of the first protruding portion is aligned with a sidewall of the first conductive pattern. A sidewall of the second protruding portion is aligned with a sidewall of the second conductive pattern. A first spacer is disposed between the first conductive pattern and the first protruding portion. A second spacer is disposed between the second conductive pattern and the second protruding portion.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION

Figure 1:
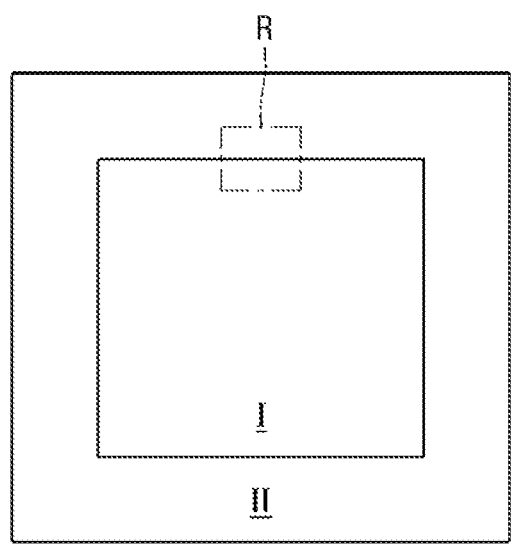
FIG. 1 is a layout view of a semiconductor device according to an exemplary embodiment of the present inventive concept.

Exemplary embodiments of the present inventive concept will be described below in more detail with reference to the accompanying drawings. In this regard, the exemplary embodiments may have different forms and should not be construed as being limited to the exemplary embodiments of the present inventive concept described herein. Like reference numerals may refer to like elements throughout the specification and drawings.

It will be understood that although the terms "first" and "second" may be used herein to describe various components, these components should not be limited by these terms.

Figure 2:
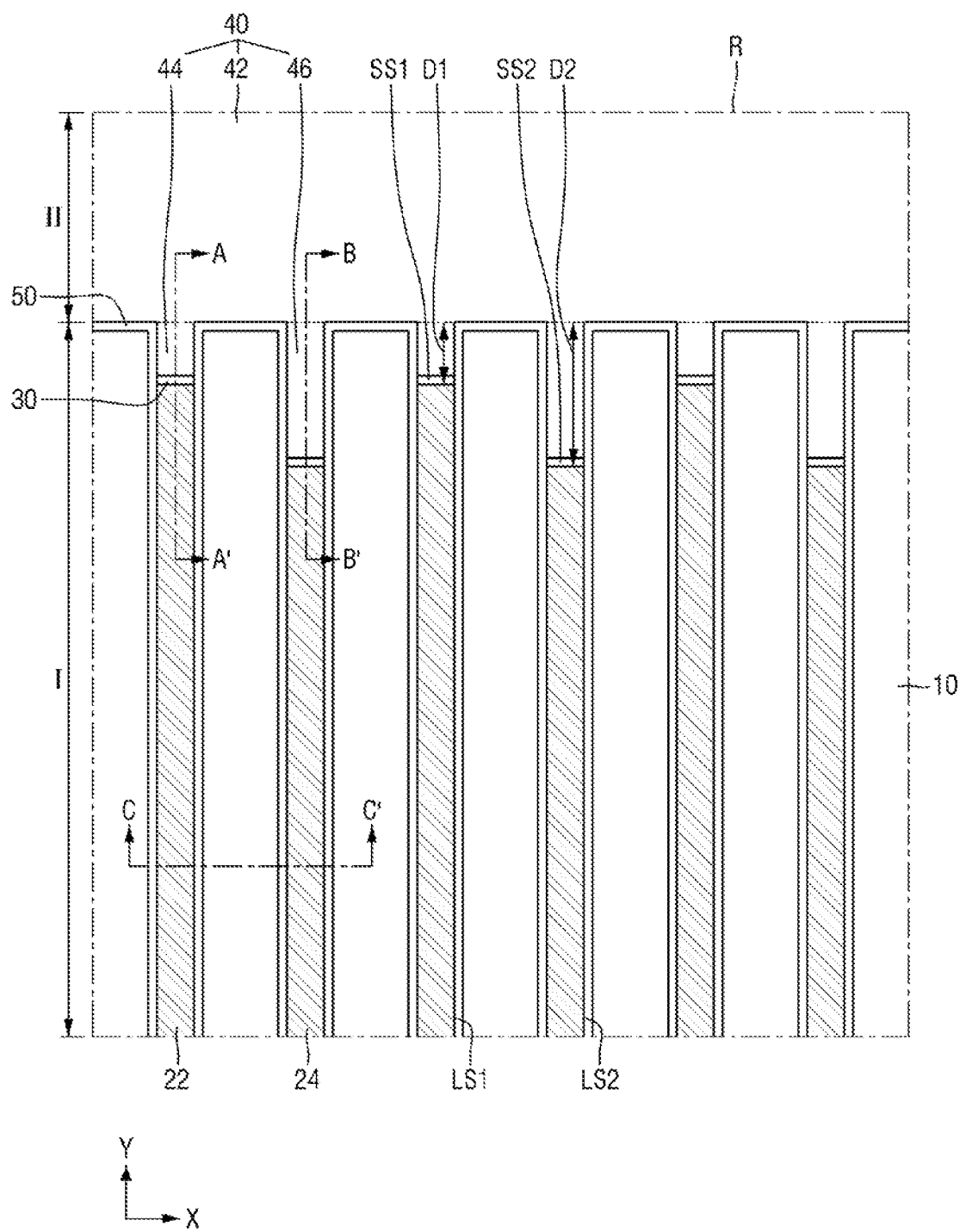
FIG. 2 is an enlarged view of a region R of FIG. 1.
Figure 3:
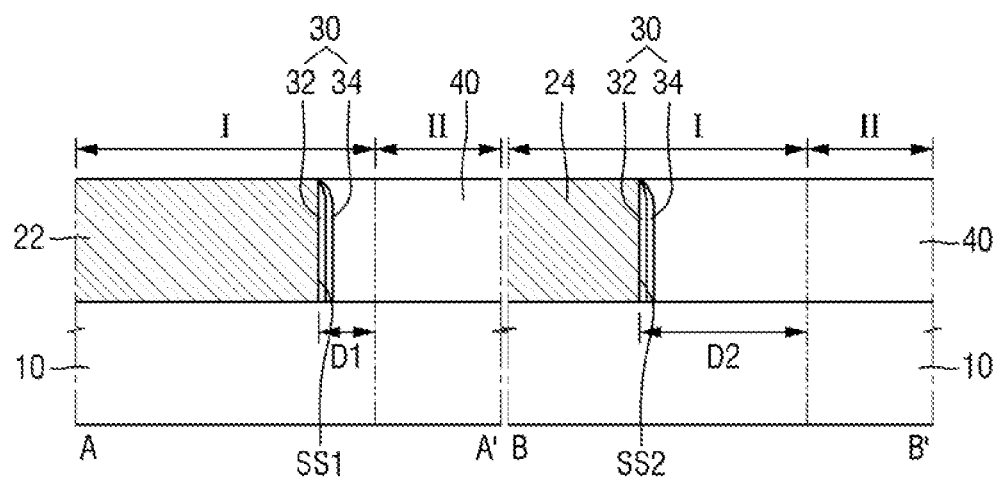
FIG. 3 is a cross-sectional view taken along lines A-A' and B-B' of FIG. 2.
Figure 4:
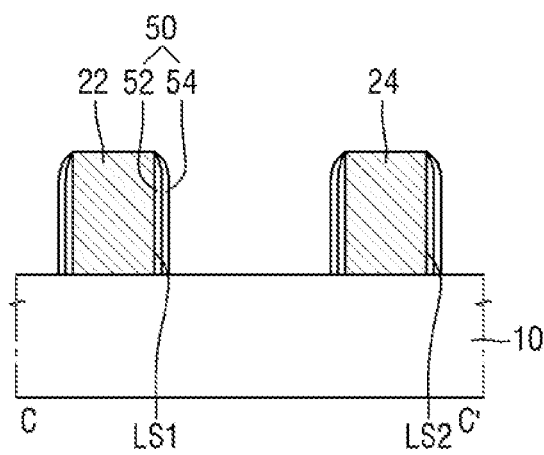
FIG. 4 is a cross-sectional view taken along line C-C' of FIG. 2.

FIG. 1 is a layout view of a semiconductor device according to an exemplary embodiment of the present inventive concept. FIG. 2 is an enlarged view of a region R of FIG. 1. FIG. 3 is a cross-sectional view taken along lines A-A' and B-B' of FIG. 2. FIG. 4 is a cross-sectional view taken along line C-C' of FIG. 2.

Referring to FIGS. 1 through 4, the semiconductor device according to an exemplary embodiment of the present inventive concept may include a substrate 10, first conductive patterns 22, second conductive patterns 24, an insulating structure 40, a first spacer 30, and a second spacer 50.

The substrate 10 may have a single layer structure or a multiple layer structure. For example, the substrate 10 may include a base substrate and an epitaxial layer disposed on the base substrate, but exemplary embodiments of the present inventive concept are not limited thereto. The substrate 10 may be a silicon (Si) substrate, a gallium arsenic (GaAs) substrate, or a semiconductor-on-insulator (SOI) substrate. The substrate 10 will be described below as being, as an example, a Si substrate.

The substrate 10 may include first and second regions I and II. The first and second regions I and II of the substrate 10 may be adjacent to each other. For example, referring to FIG. 1, the second region II may surround the first region I, but exemplary embodiments of the present inventive concept are not limited thereto. The first and second regions I and II may be arranged in various manners. For example, the second region II may be arranged at less than four sides of the first region I (e.g., at three sides of the first region I).

In an exemplary embodiment of the present inventive concept, the first region I of the substrate 10 may be a cell region where semiconductor memory elements are formed, and the second region II of the substrate 10 may be a core/peripheral region which is formed around the cell region. In the second region II of the substrate 10, control elements and dummy elements may be formed, which may control the functions of semiconductor memory elements formed on the first region I.

The first conductive patterns 22 may be disposed on the first region I of the substrate 10. The ends of the first conductive patterns 22 may be disposed adjacent to the second region II of the substrate 10. For example, referring to FIG. 2, the first and second regions I and II of the substrate 10 may be arranged along a first direction Y, which is parallel to the top surface of the substrate 10. The first conductive patterns 22 may extend along the first direction Y in the first region I.

The first conductive patterns 22 may have first long sides LS1 and first short sides SS1, which intersect the first long sides LS1. Since the first conductive patterns 22 may extend long in the first direction Y, the first long sides LS1 of the first conductive patterns 22 may extend in the first direction Y, and the first short sides SS1 of the first conductive patterns 22 may extend in a second direction X, which intersects the first direction Y. The second direction Y may be, for example, a direction intersecting the first direction X. The first direction Y may be perpendicular to the second direction X.

The second conductive patterns 24 may be disposed on the first region I of the substrate 10 and may be spaced apart from the first conductive patterns 22. For example, the second conductive patterns 24 may be spaced apart from the first conductive patterns 22 in the second direction X. The ends of the second conductive patterns 24 may be disposed adjacent to the second region II of the substrate 10. For example, referring to FIG. 2, the first and second regions I and II of the substrate 10 may be arranged along the first direction Y. The second conductive patterns 24 may extend along the first direction Y in the first region I. Accordingly, the first conductive patterns 22 and the second conductive patterns 24 may extend in parallel to one another. As an example, the end of the first conductive pattern 22 positioned in the first region I and facing the second region II may be positioned closer to the second region II than the end of the second conductive pattern 24 positioned in the first region I and facing the second region II.

The second conductive patterns 24 may have second long sides LS2 and second short sides SS2, which intersect the second long sides LS2. Since the second conductive patterns 24 may extend long in the first direction Y, the second long sides LS2 of the second conductive patterns 24 may extend in the first direction Y, and the second short sides SS2 of the second conductive patterns 24 may extend in the second direction X.

The first conductive patterns 22 and the second conductive patterns 24 may each include a conductive material. For example, the first conductive patterns 22 and the second conductive patterns 24 may each include at least one of polysilicon, a doped semiconductor (for example, doped Si, or doped Ge), a conductive metal nitride (for example, TiN, TiSiN, or TaN), a metal (for example, tungsten (W), titanium (Ti), or tantalum (Ta)), a metal-semiconductor compound (for example, tungsten silicide, cobalt silicide, or titanium silicide), or a combination thereof.

Referring to FIG. 3, the first conductive patterns 22 and the second conductive patterns 24 may each include a single-layer film, but exemplary embodiments of the present inventive concept are not limited thereto. Alternatively, the first conductive patterns 22 and the second conductive patterns 24 may each include multiple films sequentially stacked on the substrate 10. As an example, the first conductive pattern 22 may include a single-layer film and the second conductive pattern 24 may include multiple stacked films. Alternatively, the first conductive pattern 22 may include multiple stacked films and the second conductive pattern 24 may include a single-layer film.

In an exemplary embodiment of the present inventive concept, the distance between the first conductive patterns 22 and the second region II may differ from the distance between the second conductive patterns 24 and the second region II. For example, a first distance D1 between the first short sides SS1 of the first conductive patterns 22 and the second region II may be smaller than a second distance D2 between the second short sides SS2 of the second conductive patterns 24 and the second region II.

Referring to FIG. 2, when the first conductive patterns 22 and the second conductive patterns 24 are alternately arranged on the substrate 10, the ends of the first conductive patterns 22 and the ends of the second conductive patterns 24 may form a concave-convex shape (e.g., a wave pattern) in a plan view.

The insulating structure 40 may be disposed on the substrate 10. The insulating structure 40 may be adjacent to the first conductive patterns 22 and the second conductive patterns 24. For example, the insulating structure 40 may connect the first conductive patterns 22 and the second conductive patterns 24 to each other. For example, the insulating structure 40 may include the flat portion 42, first protruding portions 44, and second protruding portions 46.

The flat portion 42 of the insulating structure 40 may be disposed on the second region II of the substrate 10. A sidewall of the flat portion 42 may be formed along the boundary between the first and second regions I and II. For example, a sidewall of the flat portion 42 may extend along the second direction X at the boundary between the first and second regions I and II. For example, the sidewall of the flat portion 42 may define the boundary between the first and second regions I and II.

The first protruding portions 44 of the insulating structure 40 may protrude from the sidewall of the flat portion 42 in the first direction Y. For example, the first protruding portion 44 may extend from the boundary between the first and second regions I and II into the first region I. The first protruding portions 44 may be disposed between the flat portion 42 and the first conductive patterns 22. Accordingly, the first conductive patterns 22 may have a shape that extends from the end of the first protruding portions 44 in the first direction Y.

The second protruding portions 46 of the insulating structure 40 may be spaced apart from the first protruding portions 44 (e.g., in the second direction X) and may protrude from the sidewall of the flat portion 42 in the first direction Y. For example, the second protruding portion 46 may extend from the boundary between the first and second regions I and II into the first region I. The second protruding portions 46 may be disposed between the flat portion 42 and the second conductive patterns 24. Accordingly, the second conductive patterns 24 may have a shape that extends from the ends of the second protruding portions 46 in the first direction Y.

In an exemplary embodiment of the present inventive concept, the length by which the first protruding portions 44 extend in the first direction Y may differ from the length by which the second protruding portions 46 extend in the second direction X. For example, the distance between the first conductive patterns 22 and the second region II may be smaller than the distance between the second conductive patterns 24 and the second region II. For example, the length by which the first protruding portions 44 extend in the first direction Y into the first region I may be smaller than the length by which the second protruding portions 46 extends in the first direction Y into the first region I.

In an exemplary embodiment of the present inventive concept, the width of the first protruding portions 44 and the width of the first conductive patterns 22 may be substantially the same as each other. Similarly, in an exemplary embodiment of the present inventive concept, the width of the second protruding portions 46 and the width of the second conductive patterns 24 may be substantially the same as each other. As used herein, the term "width" may refer to a length (e.g., of insulating protruding portions or conductive patterns) in the second direction X.

According to an exemplary embodiment of the present inventive concept, the first and second conductive patterns 22 and 24 may have different widths from each other. The first protruding portion 44 may have a same width as a width of the first conductive pattern 22 and the second protruding portion 46 may have a same width as a width of the second conductive pattern 24.

In an exemplary embodiment of the present inventive concept, referring to FIG. 3, the top surface of the insulating structure 40, the top surfaces of the first conductive patterns 22, and the top surfaces of the second conductive patterns 24 may be disposed substantially on the same plane as each other. For example, the top surface of the insulating structure 40, the top surfaces of the first conductive patterns 22, and the top surfaces of the second conductive patterns 24 may be disposed substantially on the same plane as a result of a planarization process.

The insulating structure 40 may include an insulating material. For example, the insulating structure 40 may include silicon oxide.

The first spacer 30 may be disposed between the first conductive patterns 22 and the insulating structure 40 and between the second conductive patterns 24 and the insulating structure 40. For example, referring to FIG. 2, the first spacer 30 may be disposed on the first short sides SS1, which are the ends of the first conductive patterns 22 that are adjacent to the second region II, and on the second short sides SS2, which are the ends of the second conductive patterns 24 that are adjacent to the second region II. Accordingly, the first spacer 30 may extend in the second direction X.

The first spacer 30 may include at least one of, for example, silicon nitride, silicon oxynitride, silicon oxide, silicon oxycarbonitride, or a combination thereof.

In an exemplary embodiment of the present inventive concept, the first spacer 30 may include multiple films. For example, referring to FIG. 3, the first spacer 30 may include a first sub-spacer 32, which is in direct contact with the first conductive patterns 22 and the second conductive patterns 24, and a second sub-spacer 34, which is disposed on the first sub-spacer 32. For example, the first sub-spacer 32 may include silicon nitride, and the second sub-spacer 34 may include silicon oxide. However, exemplary embodiments of the present inventive concept are not limited thereto.

The second spacer 50 may be disposed between the first conductive patterns 22 and the second conductive patterns 24. The second spacer 50 may extend along sidewalk of each of the first conductive patterns 22, sidewalls of each of the second conductive patterns 24, and the sidewalls of the insulating structure 40.

For example, the second spacer 50 may extend along the sidewalls of each of the first conductive patterns 22, sidewalls of each of the first protruding portions 44, the sidewalls of the flat portion 42, sidewalk of each of the second protruding portions 46, and the sidewalls of each of the second conductive patterns 24.

Accordingly, parts of the second spacer 50 may extend over the first long sides LS1 of the first conductive patterns 22 and over the second long sides LS2 of the second conductive patterns 24. As an example, the second spacer 50 disposed on the sidewall of the first conductive pattern 22 may be spaced apart from the second spacer 50 disposed on the sidewall of the second conductive pattern 24 (e.g., in the second direction X). Other parts of the second spacer 50 may extend along the boundary between the first and second regions I and II. Accordingly, the insulating structure 40 may be disposed on parts of sidewalls of the second spacer 50.

The second spacer 50 may include at least one of, for example, silicon nitride, silicon oxynitride, silicon oxide, silicon oxycarbonitride, or a combination thereof.

In an exemplary embodiment of the present inventive concept, the second spacer 50 may include multiple films. For example, referring to FIG. 4, the second spacer 50 may include a third sub-spacer 52, which is in direct contact with the first conductive patterns 22 and the second conductive patterns 24, and a fourth sub-spacer 54, which is disposed on the third sub-spacer 52. For example, the third sub-spacer 52 may include silicon nitride, and the fourth sub-spacer 54 may include silicon oxide. However, exemplary embodiments of the present inventive concept are not limited thereto.

As the design rule of semiconductor devices has been reduced (e.g., as smaller and more highly integrated semiconductor devices have been manufactured), increasingly minute patterns may be formed to allow for the manufacturing of relatively small semiconductor devices. Due to, for example, the current limitations on resolution of photolithography processes for forming patterns for realizing semiconductor devices, there may be limit in forming patterns with minute pitches.

For example, in a case where a mask pattern (for example, a second mask pattern M2 described in more detail below with reference to FIG. 20) is used in the process of patterning the first conductive patterns 22 and the second conductive patterns 24 on the first region I, bridges may be formed to connect the ends of the first conductive patterns 22 and the ends of the second conductive patterns 24 due to the limited resolution of photolithography. These bridges may form electrical paths between the first conductive patterns 22 and the second conductive patterns 24 and may lower the yield of the semiconductor device.

However, in a semiconductor device according to an exemplary embodiment of the present inventive concept, the distance between the first conductive patterns 22 and the second region II differs from the distance between the second conductive patterns 24 and the second region II. Thus, the formation of bridges between the first conductive patterns 22 and the second conductive patterns 24 can be prevented. Accordingly, even when a mask pattern that protects the second region II is used in the process of patterning the first conductive patterns 22 and the second conductive patterns 24, the formation of bridges can be effectively prevented, and as a result, a semiconductor device with an increased process margin can be provided. For example, manufacturing costs may be reduced, manufacturing yield may be increased, and an occurrence rate of errors or defects in a semiconductor device according to an exemplary embodiment of the present inventive concept may be reduced.

According to an exemplary embodiment of the present inventive concept, a semiconductor device may include the substrate 10 and the first conductive pattern 22 disposed on the substrate. The second conductive pattern 24 may be disposed on the substrate 10. The second conductive pattern 24 may extend in parallel with the first conductive pattern 22. A length of the first conductive pattern 22 may be different from a length of the second conductive pattern 24.

The insulating structure 40 may include the first protruding portion 44 and the second protruding portion 46. A sidewall of the first protruding portion 44 may be aligned with a sidewall of the first conductive pattern 22. A sidewall of the second protruding portion 46 may be aligned with a sidewall of the second conductive pattern 24. A first spacer (e.g., one of spacers 30) may be disposed between the first conductive pattern 22 and the first protruding portion 44. A second spacer (e.g., another of spacers 30) may be disposed between the second conductive pattern 24 and the second protruding portion 46. Thus, the first and second spacers may separate the protruding portions from the conductive patterns. The first and second spacers may be spaced apart from each other along each of the first direction (e.g., the Y direction) and the second direction (e.g., the X direction), intersecting (e.g., perpendicular to), the first direction.

According to an exemplary embodiment of the present inventive concept, a third spacer (e.g., spacer 50) may be disposed on the sidewalls of each of the first conductive pattern 22, the first protruding portion 44, the second conductive pattern 24 and the second protruding portion 46. Each of the first spacer, the second spacer and the third spacer may include a first spacer layer and a second spacer layer (e.g., the first and second sub-spacer layers 32, 34, 52 and 54 described in more detail above with reference to FIGS. 3 and 4) disposed on the first spacer layer.

Figure 5:
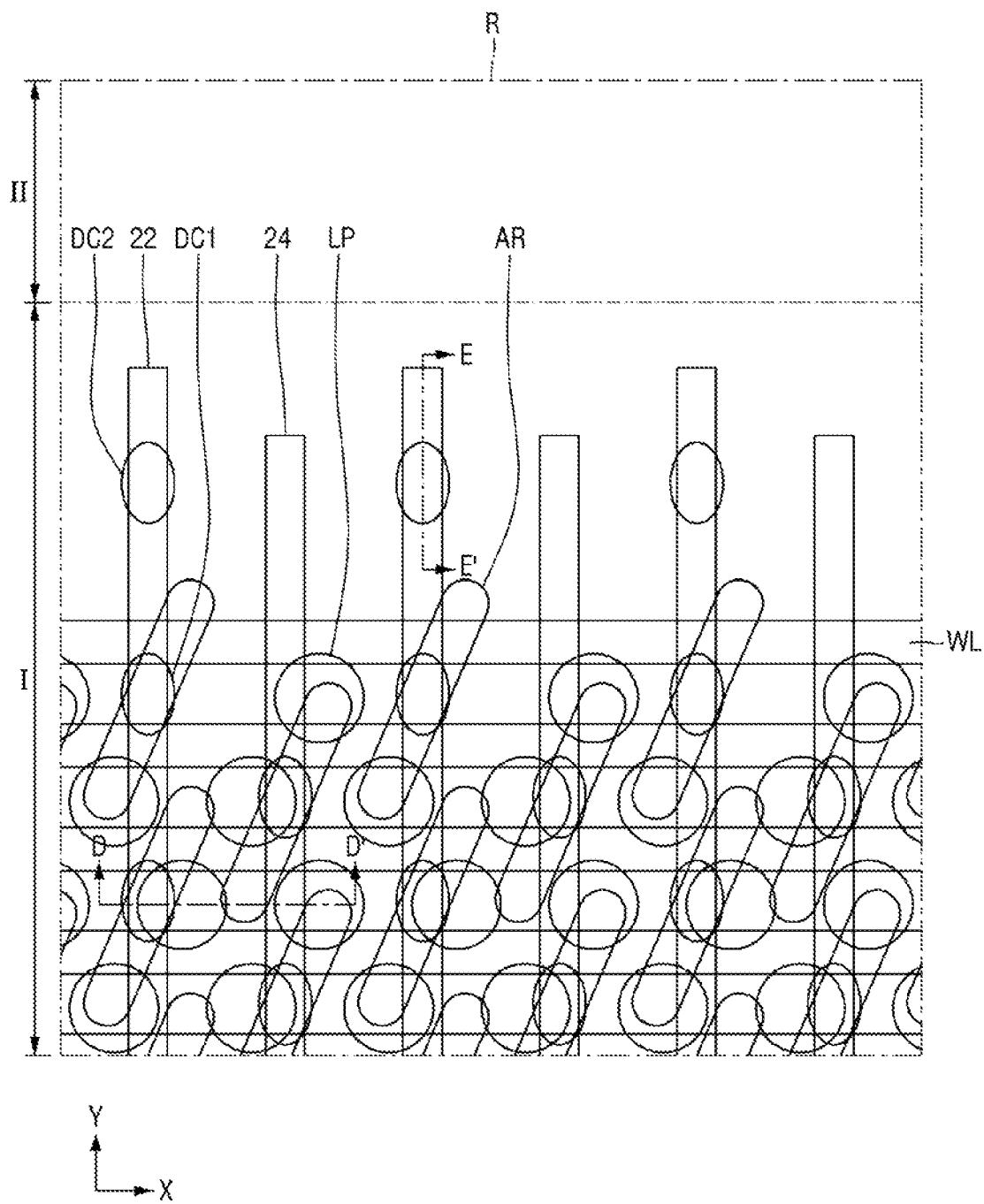
FIG. 5 is a layout view of a semiconductor device according an exemplary embodiment of the present inventive concept.
Figure 6A:
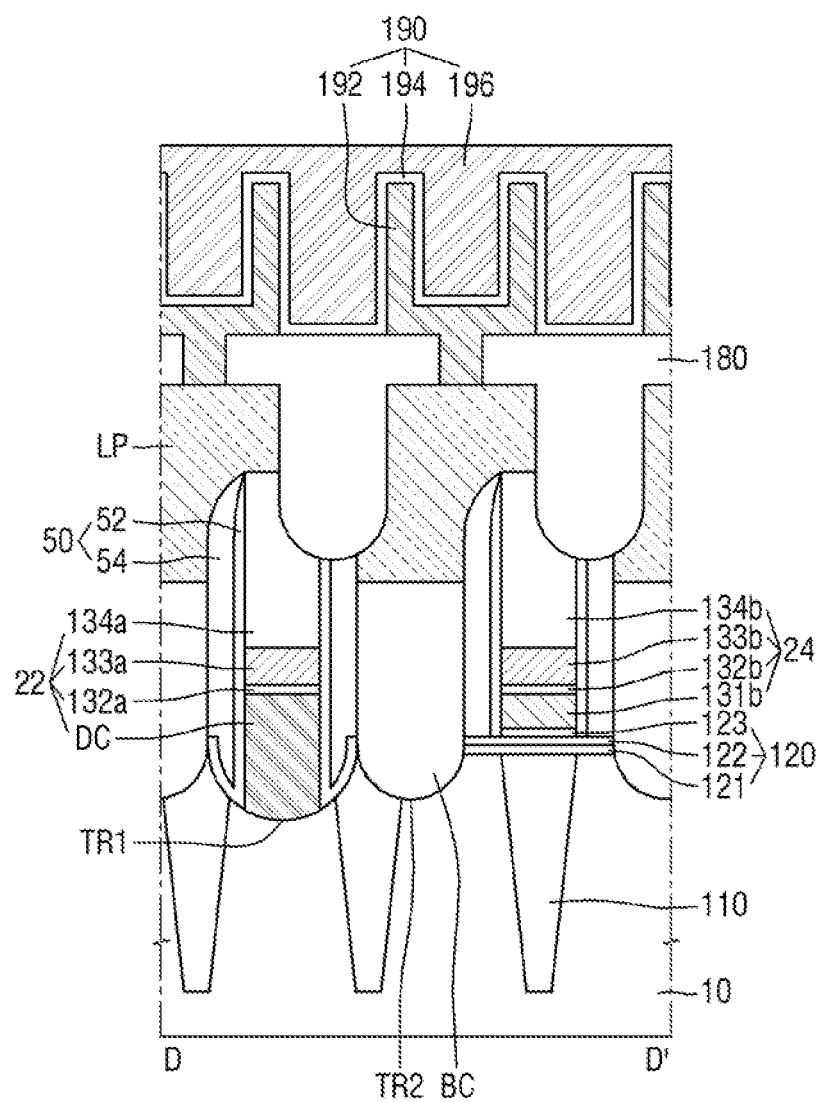
FIG. 6A is a cross-sectional view taken along line of FIG. 5.
Figure 6B:
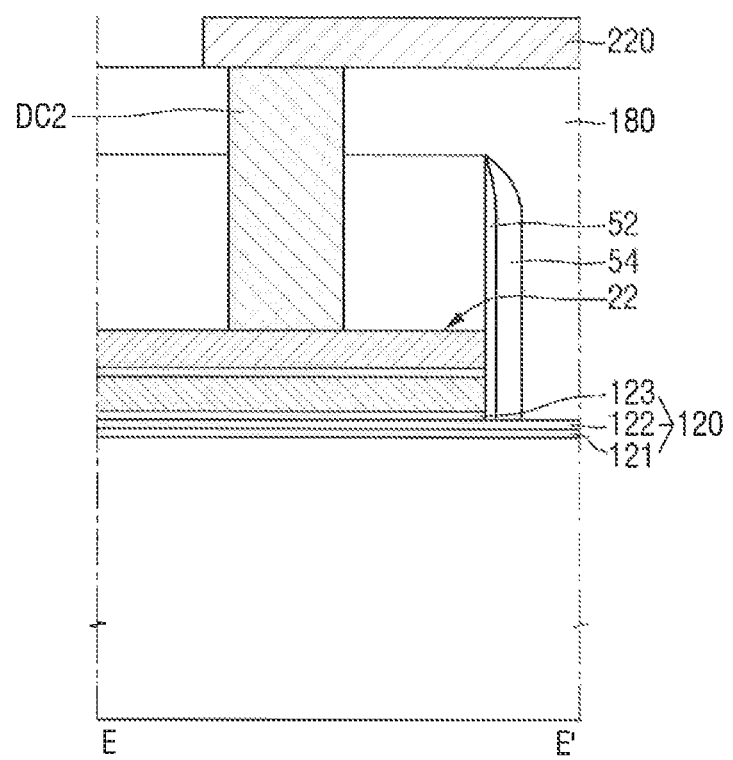
FIG. 6B is a cross-sectional view taken along line E-E' of FIG. 5.

FIG. 5 is a layout view of a semiconductor device according to an exemplary embodiment of the present inventive concept. FIG. 6A is a cross-sectional view taken along line D-D' of FIG. 5. FIG. 6B is a cross-sectional view taken along line E-E' of FIG. 5. Descriptions of components that are the same or substantially the same as those described above with reference to FIGS. 1 through 4 above may be omitted below.

Referring to FIGS. 5, 6A and 6B, a semiconductor device according to an exemplary embodiment of the present inventive concept may includes active regions AR, which are formed in the substrate 10, an isolation film 110, an insulating film 120, word lines WL, first direct contacts DC1, buried contacts BC, landing pads LP, an interlayer insulating film 180, a capacitor 190, and second direct contacts DC2.

The active regions AR may be formed in the substrate 10. As a design rule of a semiconductor device according to an exemplary embodiment of the present inventive concept becomes relatively small, the active regions AR may be formed as diagonal bars (see, e.g., FIG. 5).

For example, the active regions AR may be formed on a plane defined by first and second directions Y and X as bars extending in direction that is neither the first direction Y nor the second direction X (e.g., along a direction at an angle to the first and/or second directions Y and/or X). The active regions AR may be formed as multiple bars extending substantially in parallel to one another. The centers of the active regions AR may be disposed adjacent to the ends of their respective neighboring active regions AR.

The active regions AR may include impurities and may thus form source regions and drain regions of the semiconductor device according to an exemplary embodiment of the present inventive concept.

For example, the centers of the active regions AR may be connected to first conductive patterns 22 or second conductive patterns 24 via the first direct contacts DC1. Accordingly, the centers of the active regions AR may form either source regions or drain regions of the semiconductor device according to an exemplary embodiment of the present inventive concept. For example, opposite ends of each of the active regions AR may be connected to the buried contacts BC. Accordingly, opposite ends of each of the active regions AR may form either source regions or drain regions of the semiconductor device according to an exemplary embodiment of the present inventive concept.

The isolation film 110 may define the active regions AR. Referring to FIG. 6A, the sidewalls of the isolation film 110 may be inclined, but exemplary embodiments of the present inventive concept are not limited thereto.

The isolation film 110 may include an oxide film, a nitride film, or a combination thereof, but exemplary embodiments of the present inventive concept are not limited thereto. The isolation film 110 may be a single-layer film including one insulating material or may be a multilayer film including various insulating materials.

The insulating film 120 may be formed on the substrate 10 and the isolation film 110. For example, referring to FIG. 2, the insulating film 120 may be formed on the substrate 10 and the isolation film 110. For example, the insulating film 120 may be formed in a region on the substrate 10 where the first direct contacts DC1 are not formed.

The insulating film 120 may be a single-layer film or may be a multilayer film including first, second, and third insulating films 121, 122, and 123 (see, e.g., FIG. 6A).

The first insulating film 121 may include, for example, silicon oxide. The second insulating film 122 may include a material having a different etching selectivity from the first insulating film 121. For example, the second insulating film 122 may include silicon nitride. The third insulating film 123 may include a material having a lower dielectric constant than the second insulating film 122. For example, the third insulating film 123 may include silicon oxide.

In an exemplary embodiment of the present inventive concept, the width of the third insulating film 123 may be substantially the same as the width of bit lines BL. As used herein, the expression "the same" may mean that elements are completely the same, but also may mean that the elements have slight differences (e.g., because of a process margin) but are almost the same.

The word lines WL may extend along the second direction X across the active regions AR. A plurality of word lines WL may extend in parallel to one another. The plurality of word lines WL may be a predetermined distance apart from one another. In an exemplary embodiment of the present inventive concept, the word lines WL may be buried in the substrate 10, but exemplary embodiments of the present inventive concept are not limited thereto.

The first conductive patterns 22 and the second conductive patterns 24 may be disposed on the substrate 10 and the insulating film 120. The first conductive patterns 22 and the second conductive patterns 24 may extend along the first direction Y across the active regions AR and the word lines WL. Accordingly, the first conductive patterns 22 and the second conductive patterns 24 may extend diagonally across the active regions AR and vertically (e.g., perpendicularly) across the word lines WL. A plurality of first conductive patterns 22 and a plurality of second conductive patterns 24 may extend in parallel to one another. The plurality of first conductive patterns 22 and the plurality of second conductive patterns 24 may be a predetermined distance apart from one another. The first conductive patterns 22 and the second conductive patterns 24 may be bit lines of the semiconductor device according to an exemplary embodiment of the present inventive concept.

The first direct contacts DC1 may be firmed below the first or second conductive patterns 22 or 24. For example, the first direct contacts DC1 may be formed in first trenches TR1 in the substrate 10. For example, the first and second conductive patterns 22 and 24 may extend along a same plane as each other with respect to an upper surface of the substrate 10, which may be at a different depth than a depth at which the first direct contacts DC1 are positioned with respect to the upper surface of the substrate 10. As an example, the first direct contacts DC1 may be in direct contact with the substrate 10. For example, the first direct contacts DC1 may be in direct contact with central parts of the active regions AR that are exposed by the first trenches TR1.

The first direct contacts DC1 may include a conductive material. Accordingly, parts of the first or second conductive patterns 22 or 24 may be electrically connected to the active regions AR. The active regions AR of the substrate 10, which are in direct contact with the first direct contacts DC1, may serve as source regions or drain regions of the semiconductor device according to an exemplary embodiment of the present inventive concept. Parts of the first or second conductive patterns 22 or 24 where the first direct contacts DC1 are not formed may be formed on the insulating film 120.

The first conductive patterns 22 and the second conductive patterns 24 may each include a single-layer film, or may include multilayer films (see, e.g., FIG. 6A). For example, each of the first conductive patterns 22 may include a first direct contact DC1, a first conductive line 132a, a second conductive line 133a, and a first capping line 134a, which are sequentially stacked on the substrate 10. For example, each of the second conductive pattern 24 may include a third conductive line 131b, a fourth conductive line 132b, a fifth conductive line 133b, and a second capping line 134b, which are sequentially stacked on the substrate 10.

For example, the first direct contacts DC1 of the first conductive patterns 22 may include polysilicon, the first conductive lines 132a of the first conductive patterns 22 may include a conductive metal nitride (for example, TiSiN), the second conductive lines 133a of the first conductive patterns 22 may include a metal (for example, W), and the first capping lines 134a of the first conductive patterns 22 may include silicon nitride. However, exemplary embodiments of the present inventive concept are not limited thereto. For example, the third conductive lines 131b of the second conductive pattern 24 may include polysilicon, the fourth conductive lines 132b of the second conductive pattern 24 may include a conductive metal nitride (TiSiN), the fifth conductive lines 133b of the second conductive pattern 24 may include a metal (for example, W), and the second capping lines 134b of the second conductive pattern 24 may include silicon nitride. However, exemplary embodiments of the present inventive concept are not limited thereto.

The buried contacts BC may be disposed on the substrate 10, for example, between the first conductive patterns 22 and the second conductive patterns 24. For example, the buried contacts BC may be disposed in areas defined by the word lines WL, the first conductive patterns 22, and the second conductive patterns 24. The buried contacts BC may form a plurality of isolated areas that are separate from one another.

The buried contacts BC may be in direct contact with the substrate 10. For example, the buried contacts BC may be in direct contact with the ends of the active regions AR (e.g., described with reference to FIG. 5). Parts of the active regions AR that are in direct contact with the buried contacts BC may serve as source regions or drain regions of the semiconductor device according to an exemplary embodiment of the present inventive concept.

In an exemplary embodiment of the present inventive concept, the buried contacts BC may be formed to fill second trenches TR2 in the substrate 10.

The buried contacts BC may include a conductive material. Accordingly, the buried contacts BC may be electrically connected to the active regions AR. The buried contacts BC may include, for example, polysilicon, but exemplary embodiments of the present inventive concept are not limited thereto.

The landing pads LP may be disposed on parts of the top surfaces of the first or second conductive patterns 22 or 24 and on the buried contacts BC. The landing pads LP may be in direct contact with the buried contacts BC. The landing pads LP may form a plurality of isolated regions that are separate from one another.

The landing pads LP may include a conductive material and may thus be electrically connected to the buried contacts BC. For example, the landing pads LP may include W, but exemplary embodiments of the present inventive concept are not limited thereto.

The interlayer insulating film 180 may be formed on parts of the top surfaces of the landing pads LP and on parts of the first or second conductive patterns 22 or 24. The interlayer insulating film 180 may define the landing pads LP, which form a plurality of isolated regions. For example, the interlayer insulating film 180 may separate the landing pads LP from one another. The interlayer insulating film 180 may be patterned to at least partially expose the top surfaces of the landing pads LP.

The interlayer insulating film 180 may include an insulating material and may thus electrically isolate the landing pads LP from one another. For example, the interlayer insulating film 180 may include silicon oxide, but exemplary embodiments of the present inventive concept are not limited thereto.

The capacitor 190 may be disposed on the interlayer insulating film 180 and the landing pads LP. The capacitor 190 may be connected to parts of the top surfaces of the landing pads LP, exposed by the interlayer insulating film 180. As a result, the capacitor 190 may be electrically connected to the source regions and the drain regions of the semiconductor device according to an exemplary embodiment of the present inventive concept that are connected to the buried contacts BC. Accordingly, the capacitor 190 may store charges in, for example, semiconductor memory elements.

For example, referring to FIG. 6A, the capacitor 190 may include a lower electrode 192, a capacitor dielectric film 194, and an upper electrode 196. The capacitor 190 may store charges in the capacitor dielectric film 194 using an electrical potential difference generated between the lower electrode 192 and the upper electrode 196.

The lower electrode 192 and the upper electrode 196 may include, for example, doped polysilicon, a metal, or a metal nitride. The capacitor dielectric film 194 may include, for example, silicon oxide or a high-k material.

The second direct contacts DC2 may be formed on end portions of the first conductive patterns 22. The second direct contacts DC2 may be electrically connected to the first conductive patterns 22 from above the first conductive patterns 22. For example, referring to FIG. 6B, the second direct contacts DC2 may penetrate the first capping lines 134a and may be electrically connected to the first conductive patterns 22. The second direct contacts DC2 may be electrically connected to the second conductive patterns 24.

The second direct contacts DC2 may be electrically connected to wires 220 on the interlayer insulating film 180.

The wires 220 may be positioned in the first region I of the substrate 10. The wires 220 may extend from a second region II of the substrate 10. Thus, the wires 220 may overlap each of the first region I and the second region II of the substrate 10. Accordingly, some control elements on the second region II of the substrate 10 may be connected to the first conductive patterns 22 and may thus control the functions of, for example, semiconductor memory elements formed in a first region I of the substrate 10. For example, sense amplifiers on the second region II may be connected to the first conductive patterns 22.

Figure 7:
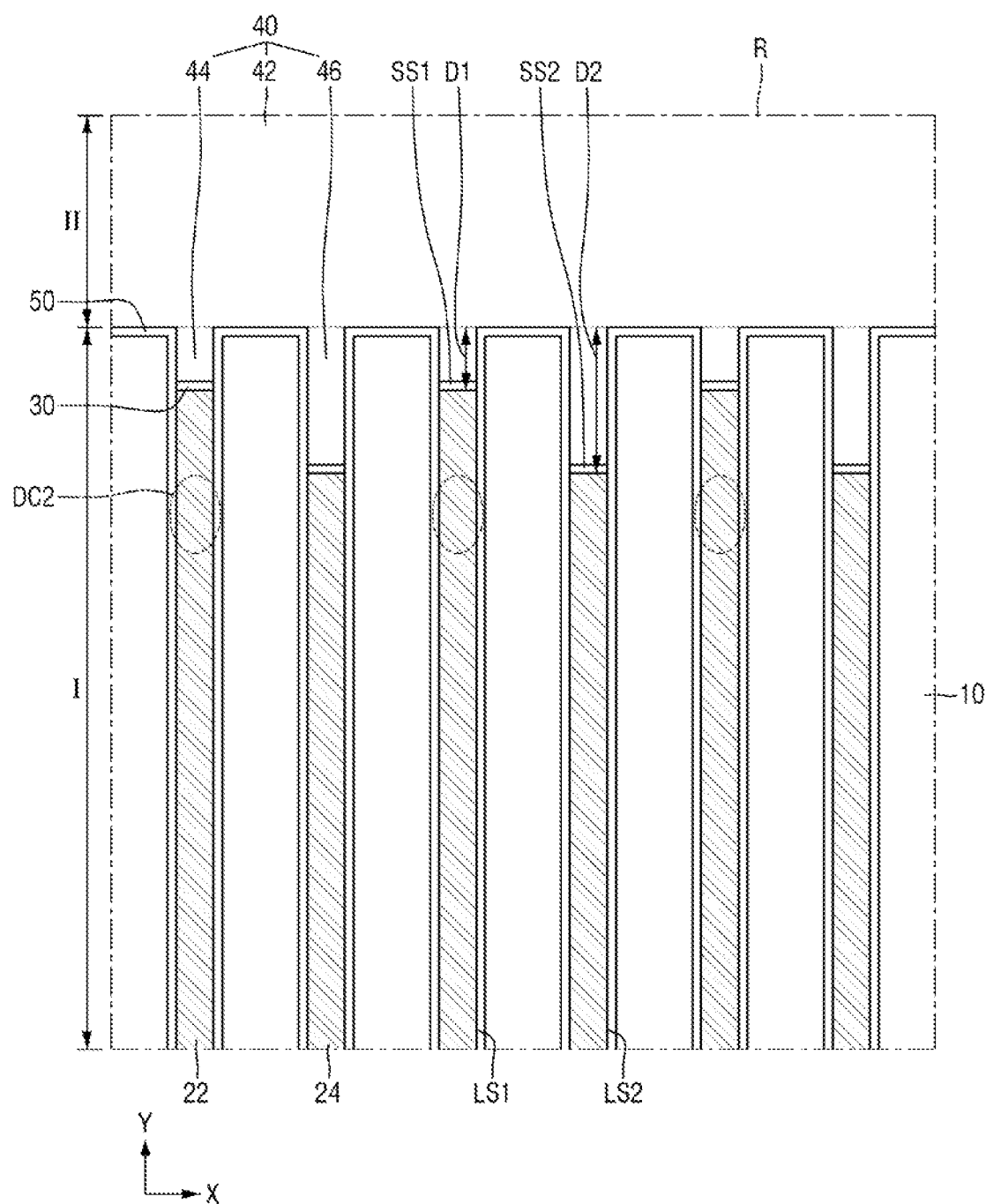
FIG. 7 is a schematic layout view of the first conductive patterns and the second conductive patterns of FIG. 5.

FIG. 7 is a schematic layout view of the first conductive patterns and the second conductive patterns of FIG. 5. Descriptions of components that are the same or substantially the same as those described above with reference to FIGS. 1 through 6B above may be omitted below.

Referring to FIG. 7, the semiconductor device according to an exemplary embodiment of the present inventive concept may include a plurality of second direct contacts DC2. The second direct contacts DC2 may extend in the second direction X.

In an exemplary embodiment of the present inventive concept, at least some of the second conductive patterns 24 may overlap with the second direct contacts DC2. For example, the ends of the second conductive patterns 24 that are adjacent to the second region II may overlap, in the second direction X, with the second direct contacts DC2 that are adjacent to the second region II.

Even in this case, the distance between the first conductive patterns 22 and the second region II may be smaller than the distance between the second conductive patterns 24 and the second region II.

Accordingly, the semiconductor device according to an exemplary embodiment of the present inventive concept can prevent the formation of bridges between the first conductive patterns 22 and the second conductive patterns 24. Further, the semiconductor device according to an exemplary embodiment of the present inventive concept can maximize the utilization areas of the second conductive patterns 24, even in a relatively small and highly integrated semiconductor device.

Figure 8:
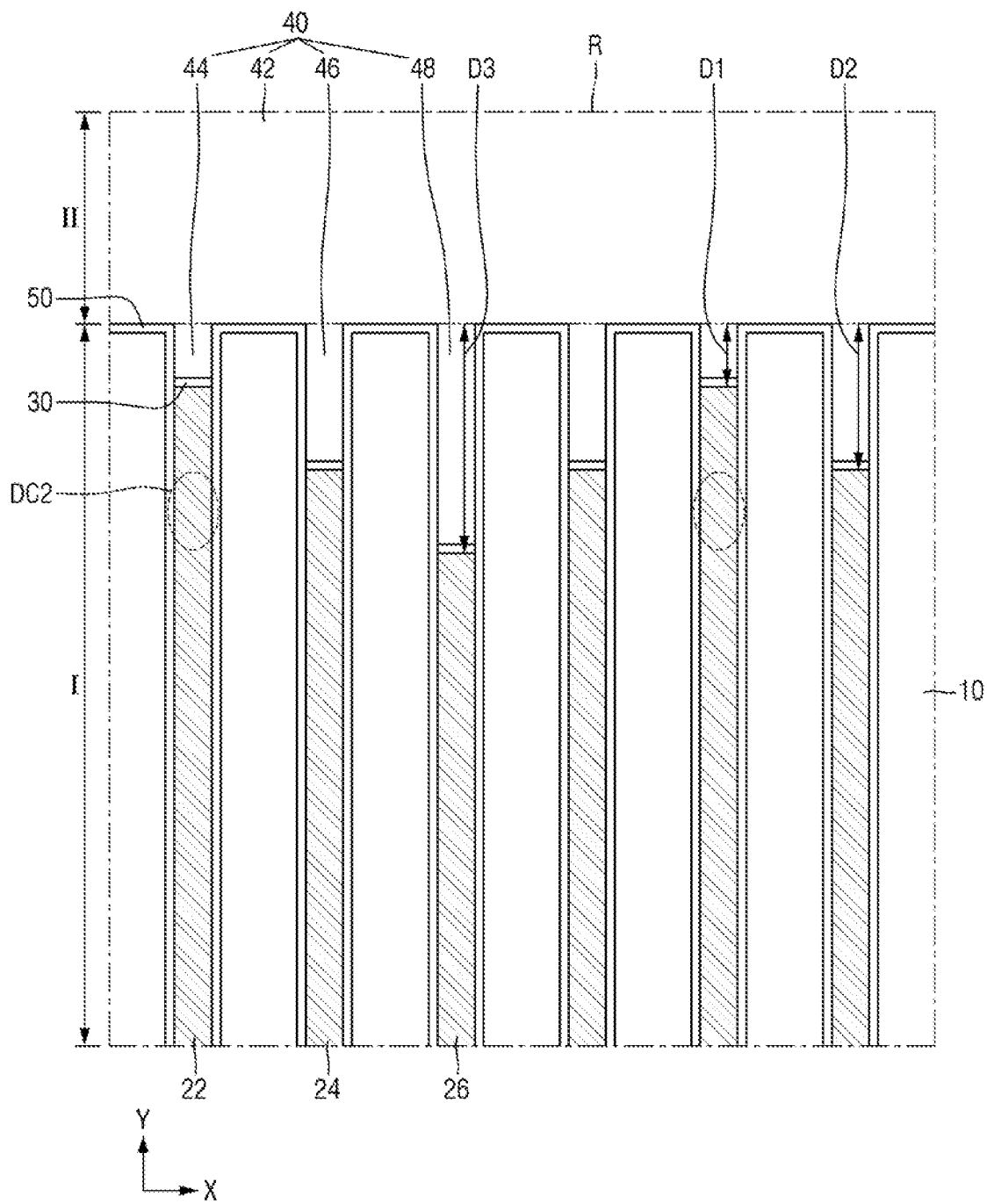
FIG. 8 is a layout view of a semiconductor device according to an exemplary embodiment of the present inventive concept.

FIG. 8 is a layout view of a semiconductor device according to an exemplary embodiment of the present inventive concept. Descriptions of components that are the same or substantially the same as those described above with reference to FIGS. 1 through 7 above may be omitted below.

Referring to FIG. 8, the semiconductor device according to an exemplary embodiment of the present inventive concept may further include third conductive patterns 26.

The third conductive patterns 26 may be disposed on the first region I of a substrate 10 spaced apart from first conductive patterns 22 and second conductive patterns 24. An end of the third conductive patterns 26 may be disposed adjacent to the second region II of the substrate 10. For example, the first and second regions I and II of the substrate 10 may be arranged along the first direction Y. Accordingly, the first conductive patterns 22, the second conductive patterns 24, and the third conductive patterns 26 may extend in parallel to one another (e.g., along the first direction Y). For example, the second conductive patterns 24 may be disposed between the first conductive patterns 22 and the third conductive patterns 26. A space between the first conductive pattern 22 and the second conductive pattern 24 may be substantially the same width as a space between the second conductive pattern 24 and the third conductive pattern 26. Alternatively, the space the first conductive pattern 22 and the second conductive pattern 24 may a different width than a space between the second conductive pattern 24 and the third conductive pattern 26.

In an exemplary embodiment of the present inventive concept, the distance between the third conductive patterns 26 and the second region II may be greater than the distance between the second conductive patterns 24 and the second region II. For example, a third distance D3 between the third conductive patterns 26 and the second region II may be greater than a second distance D2 between the second conductive patterns 24 and the second region II.

In a case where the first conductive patterns 22, the second conductive patterns 24, and the third conductive patterns 26 are alternately arranged (see, e.g., FIG. 8), the ends of the first conductive patterns 22, the ends of the second conductive patterns 24, and the ends of the third conductive patterns 26 may form a stepped shape in a plan view.

The insulating structure 40 may be disposed adjacent to the first conductive patterns 22 and the second conductive patterns 24 on the substrate 10. For example, the insulating structure 40 may include third protruding portions 48.

The third protruding portions 48 of the insulating structure 40 may be spaced apart from first protruding portions 44 and second protruding portions 46 and may protrude from a sidewall of the flat portion 42 in the first direction Y. The third protruding portions 48 may be disposed between the flat portion 42 and the third conductive patterns 26. Accordingly, the third conductive patterns 26 may have a shape that extends from the ends of the third protruding portions 48 in the first direction Y.

In an exemplary embodiment of the present inventive concept, the length by which the third protruding portions 48 extends in the first direction Y may differ from the length by which the second protruding portions 46 extends in the first direction Y. For example, the distance between the third conductive pattern 26 and the second region II may be greater than the distance between the second conductive patterns 24 and the second region II. In this example, the length by which the third protruding portions 48 extend in the first direction Y may be greater than the length by which the second protruding portions 46 extend in the first direction Y.

Figure 9:
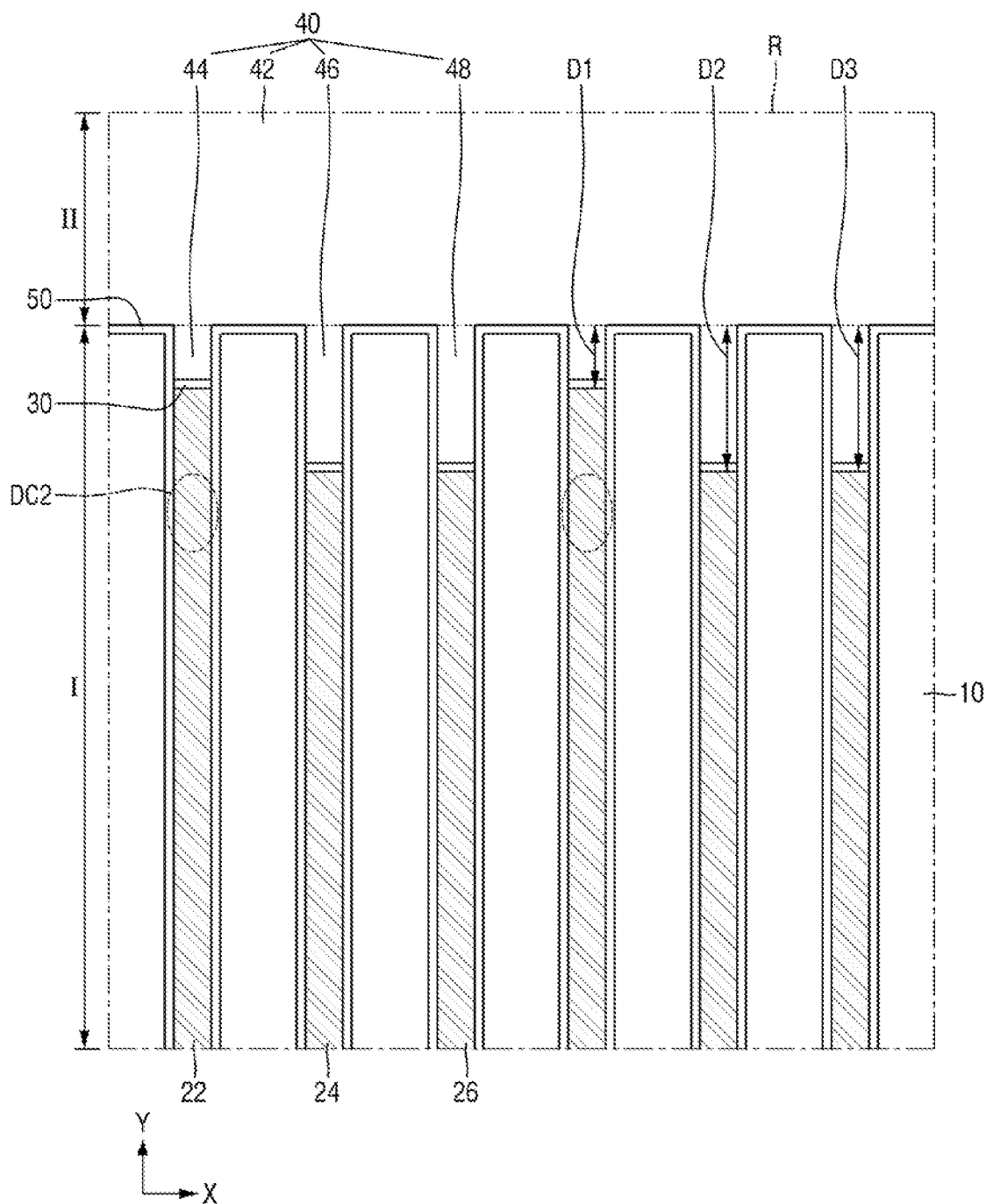
FIG. 9 is a layout view of a semiconductor device according to an exemplary embodiment of the present inventive concept.

FIG. 9 is a layout view of a semiconductor device according to an exemplary embodiment of the present inventive concept. Descriptions of components that are the same or substantially the same as those described above with reference to FIGS. 1 through 8 above may be omitted below.

Referring to FIG. 9, in an exemplary embodiment of the present inventive concept, the distance between third conductive patterns 26 and the second region II of the substrate 10 may be substantially the same as the distance between second conductive patterns 24 and the second region II.

For example, a third distance D3 between the third conductive patterns 26 and the second region II may be substantially the same as the second distance D2 between the second conductive patterns 24 and the second region II.

Referring to FIG. 9, in a case where first conductive patterns 22, the second conductive patterns 24, and the third conductive patterns 26 are alternately arranged on the substrate 10, the ends of the first conductive patterns 22, the ends of the second conductive patterns 24, and the ends of the third conductive patterns 26 may form a concave-convex shape in a plan view.

In an exemplary embodiment of the present inventive concept, the length by which third protruding portions 48 extend in the first direction Y may be substantially the same as the length by which second protruding portions 46 extend in the first direction Y. For example, the distance between the third conductive patterns 26 and the second region II may be substantially the same as the distance between the second conductive patterns 24 and the second region II. In this example, the length by which the third protruding portions 48 extend in the first direction Y may be substantially the same as the length by which the second protruding portions 46 extend in the first direction Y.

A method of fabricating a semiconductor device according to an exemplary embodiment of the present inventive concept will be described in more detail below with reference to FIGS. 10 through 40.

FIGS. 10 through 25 are schematic views of a method of fabricating a semiconductor device according to an exemplary embodiment of the present inventive concept. Descriptions of components that are the same or substantially the same as those described above with reference to FIGS. 1 through 4 above may be omitted below.

Figure 11:
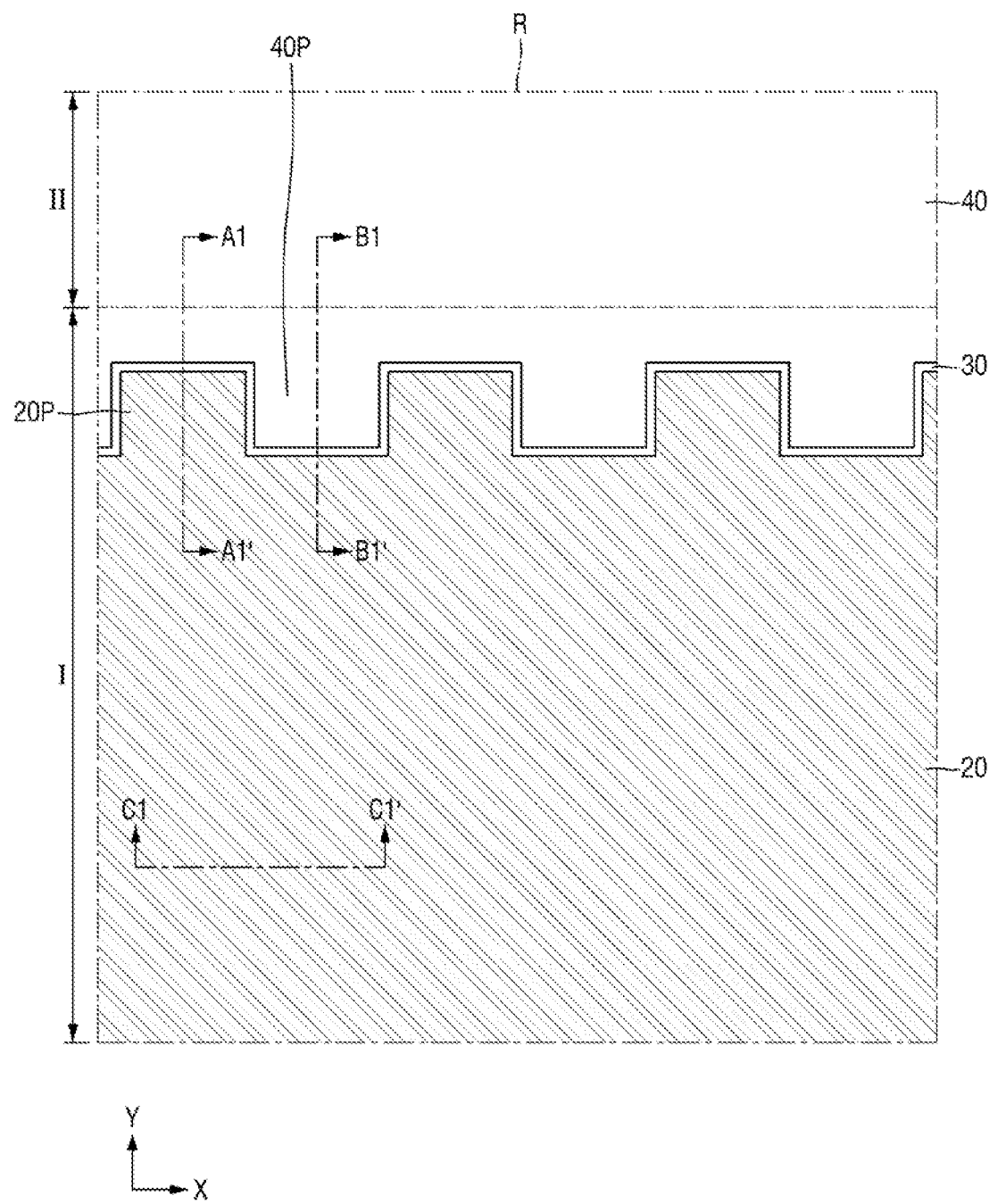
Figure 12:
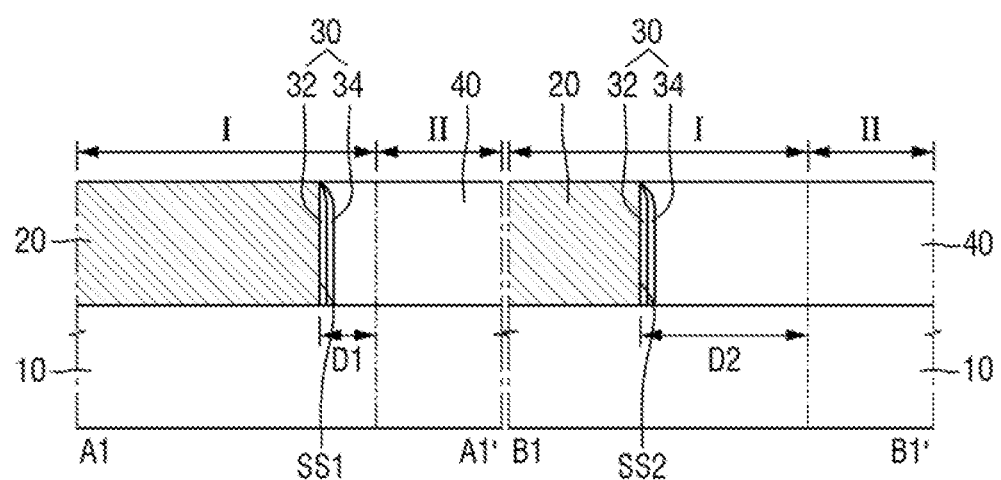
Figure 13:
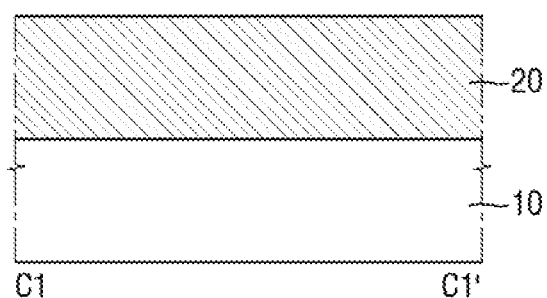
Figure 14:
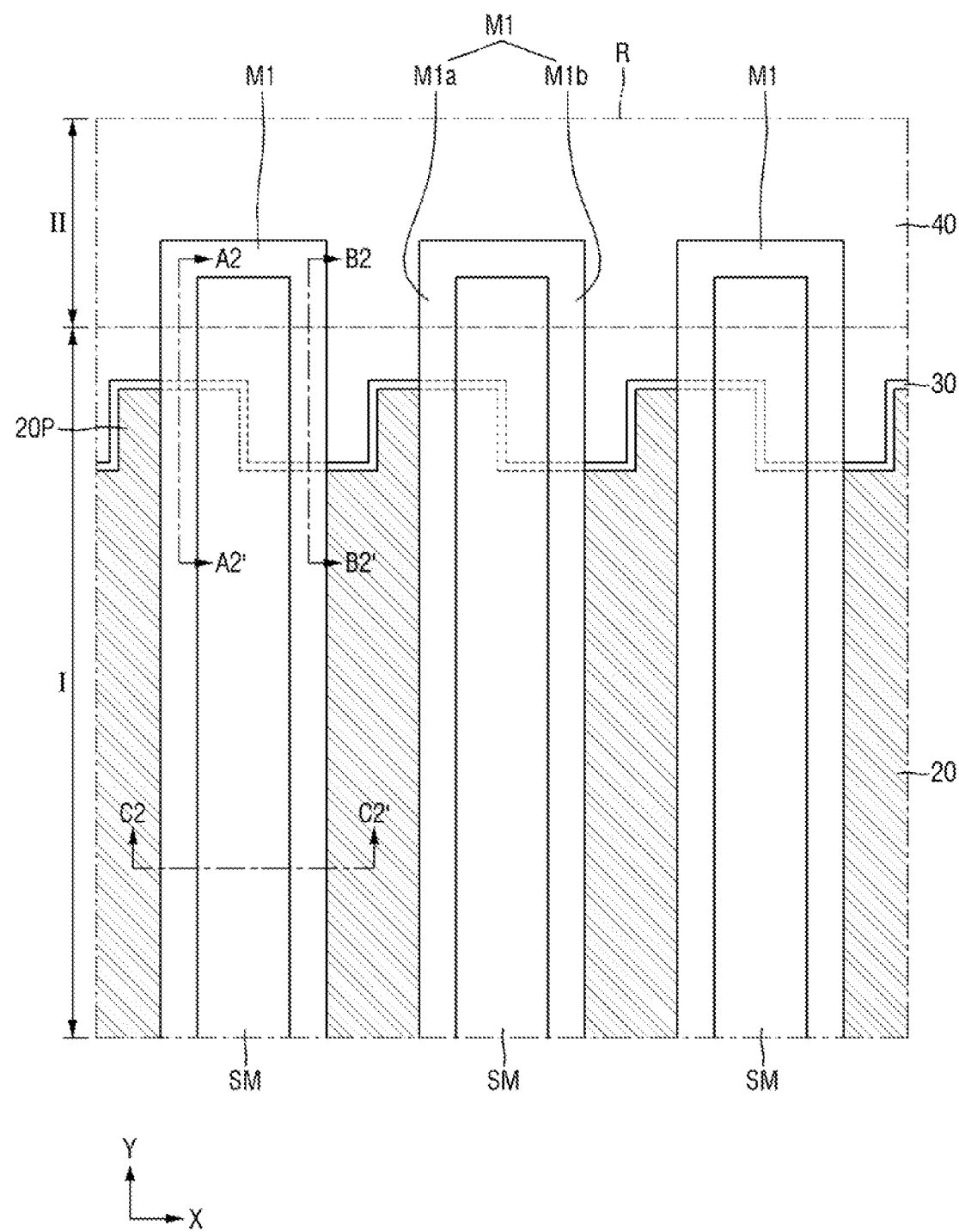
Figure 15:
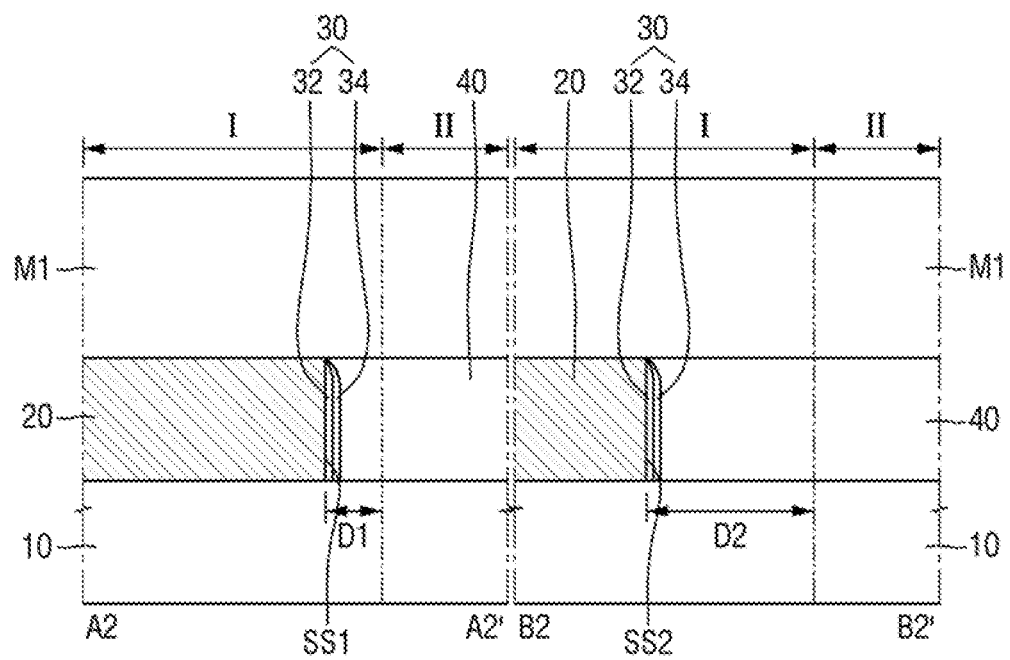
Figure 16:
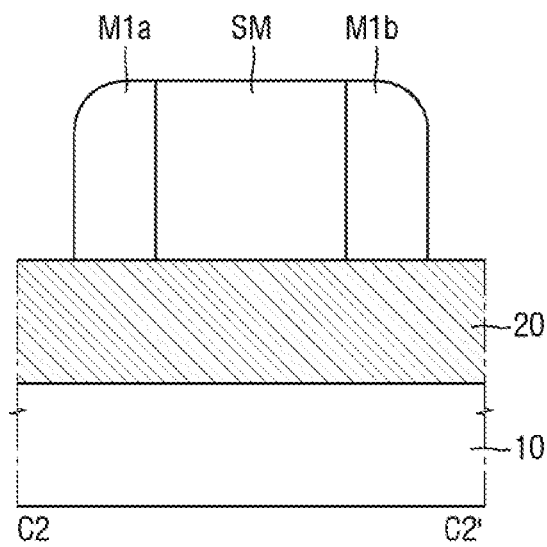
Figure 17:
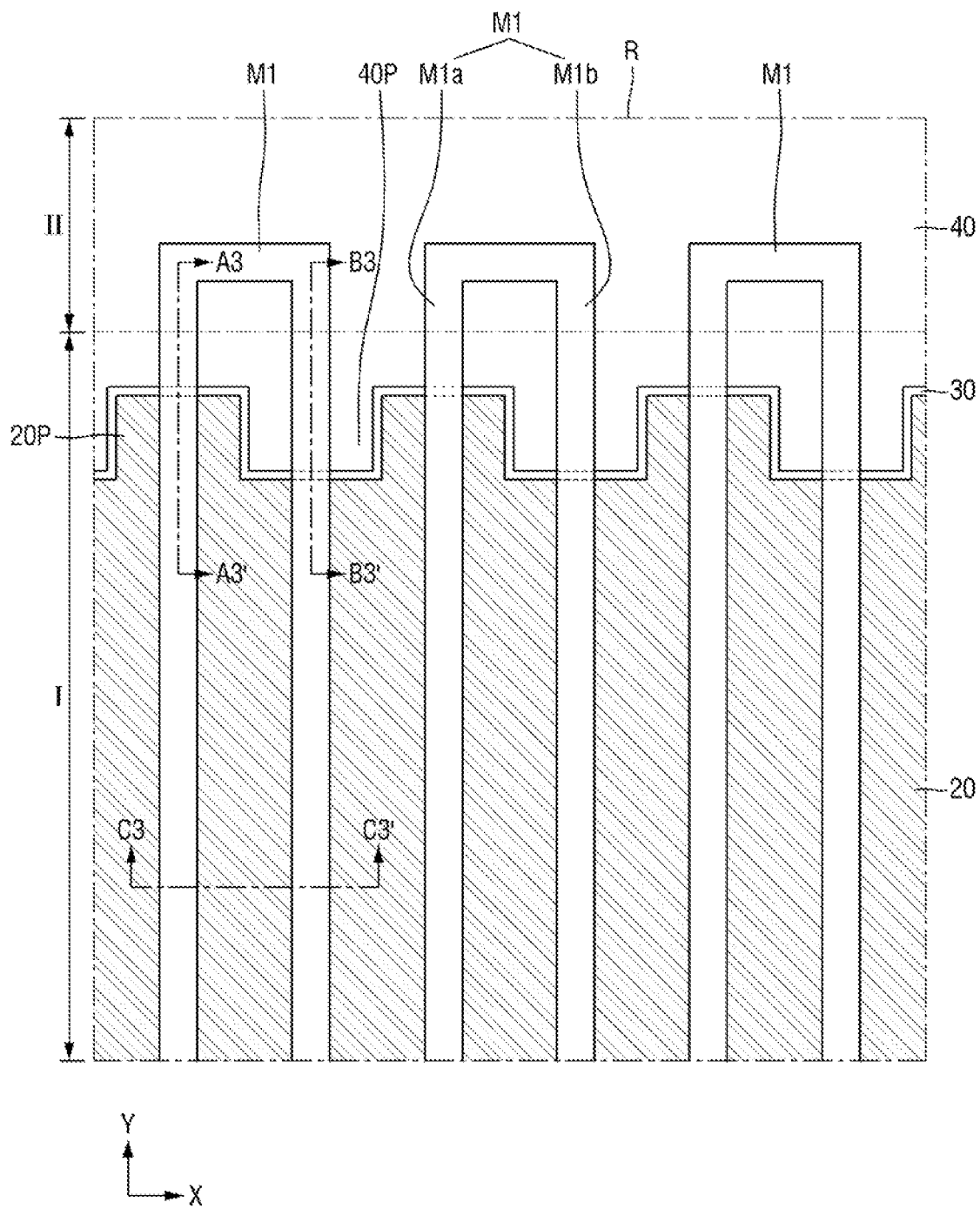
Figure 18:
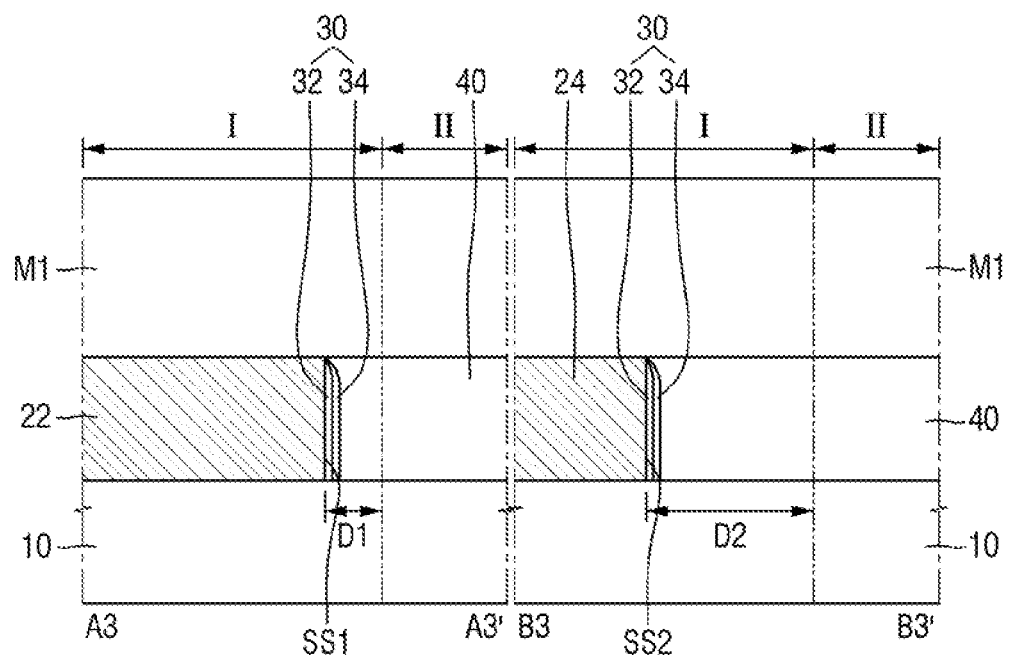
Figure 19:
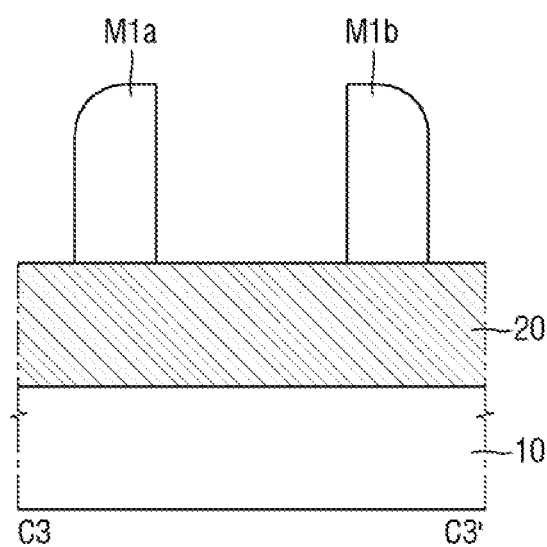
Figure 20:
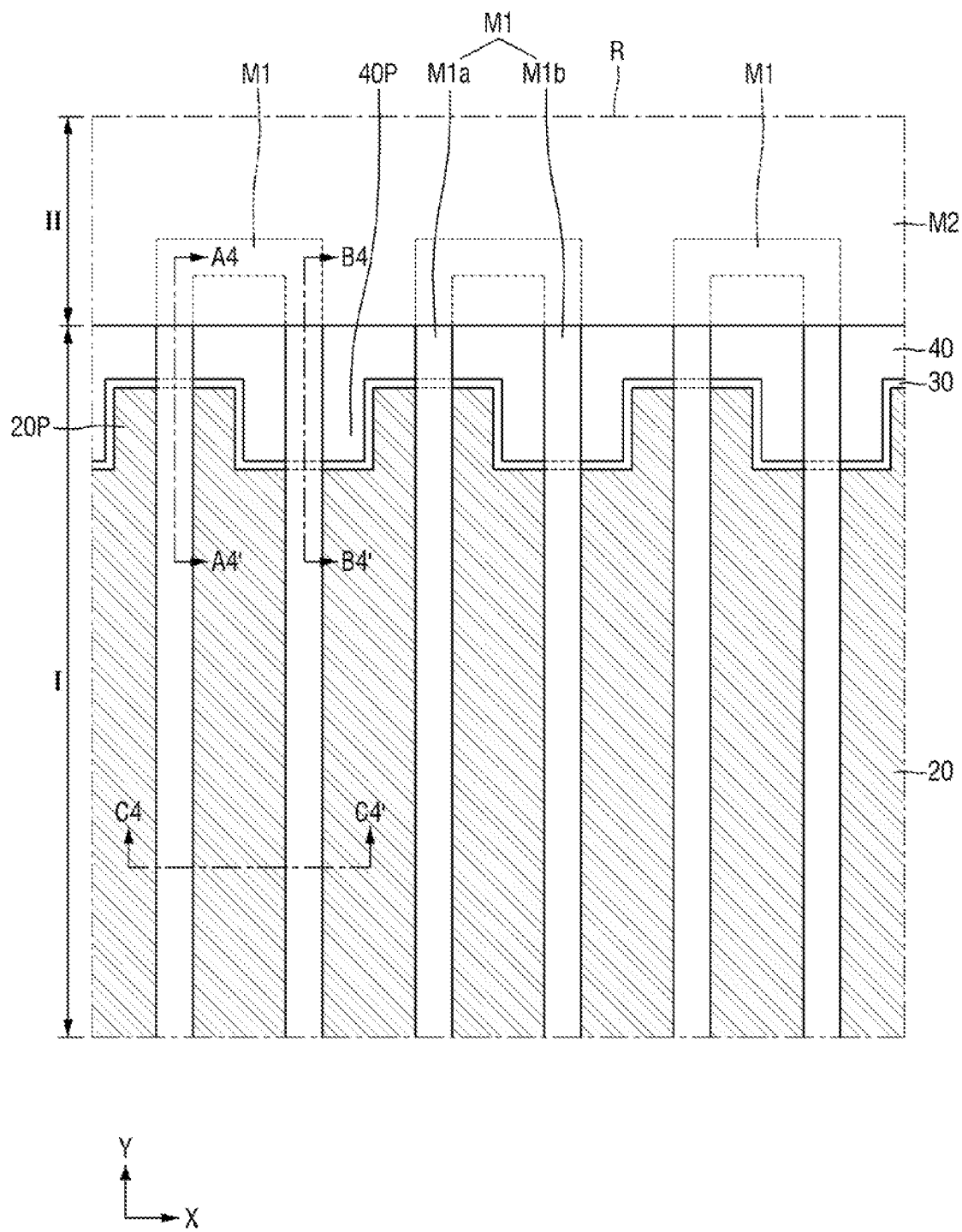
Figure 21:
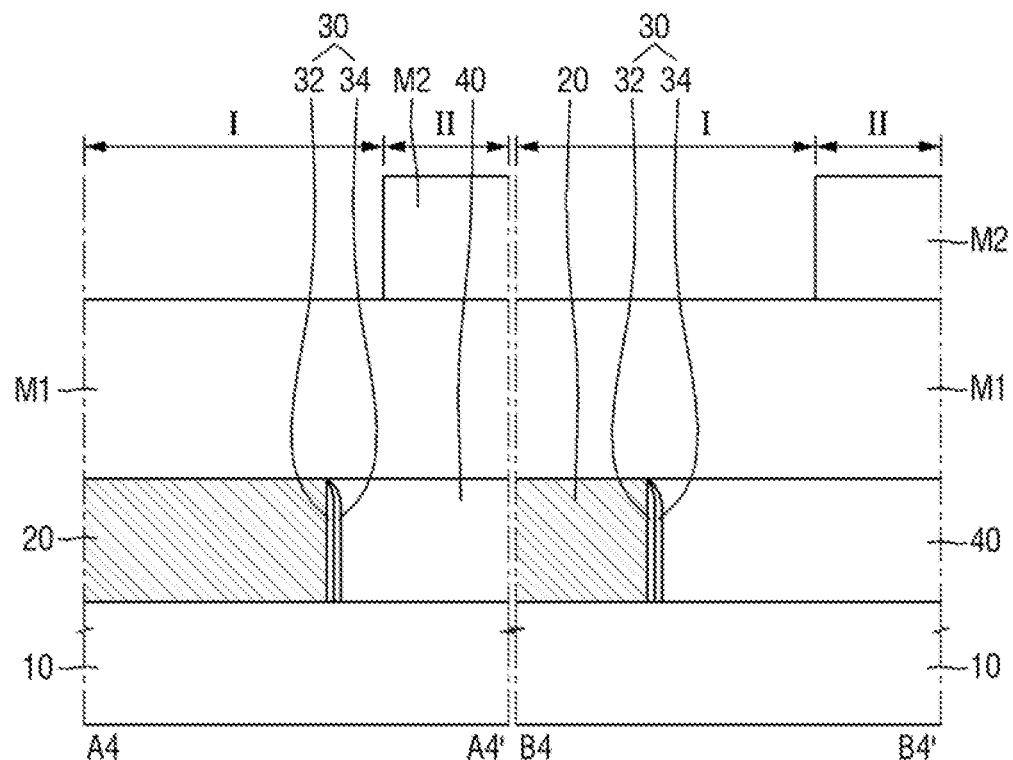
Figure 22:
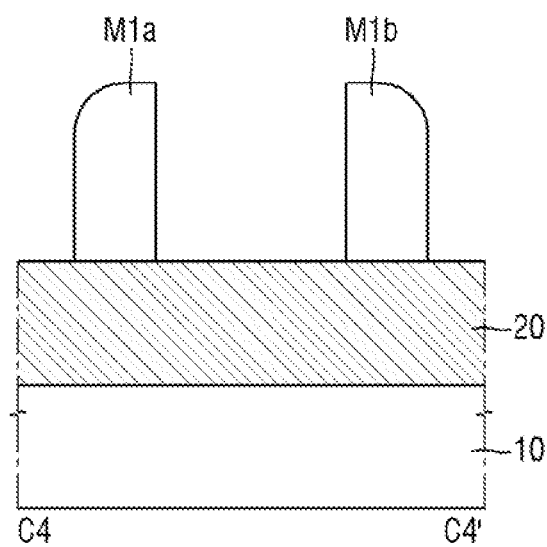
Figure 23:
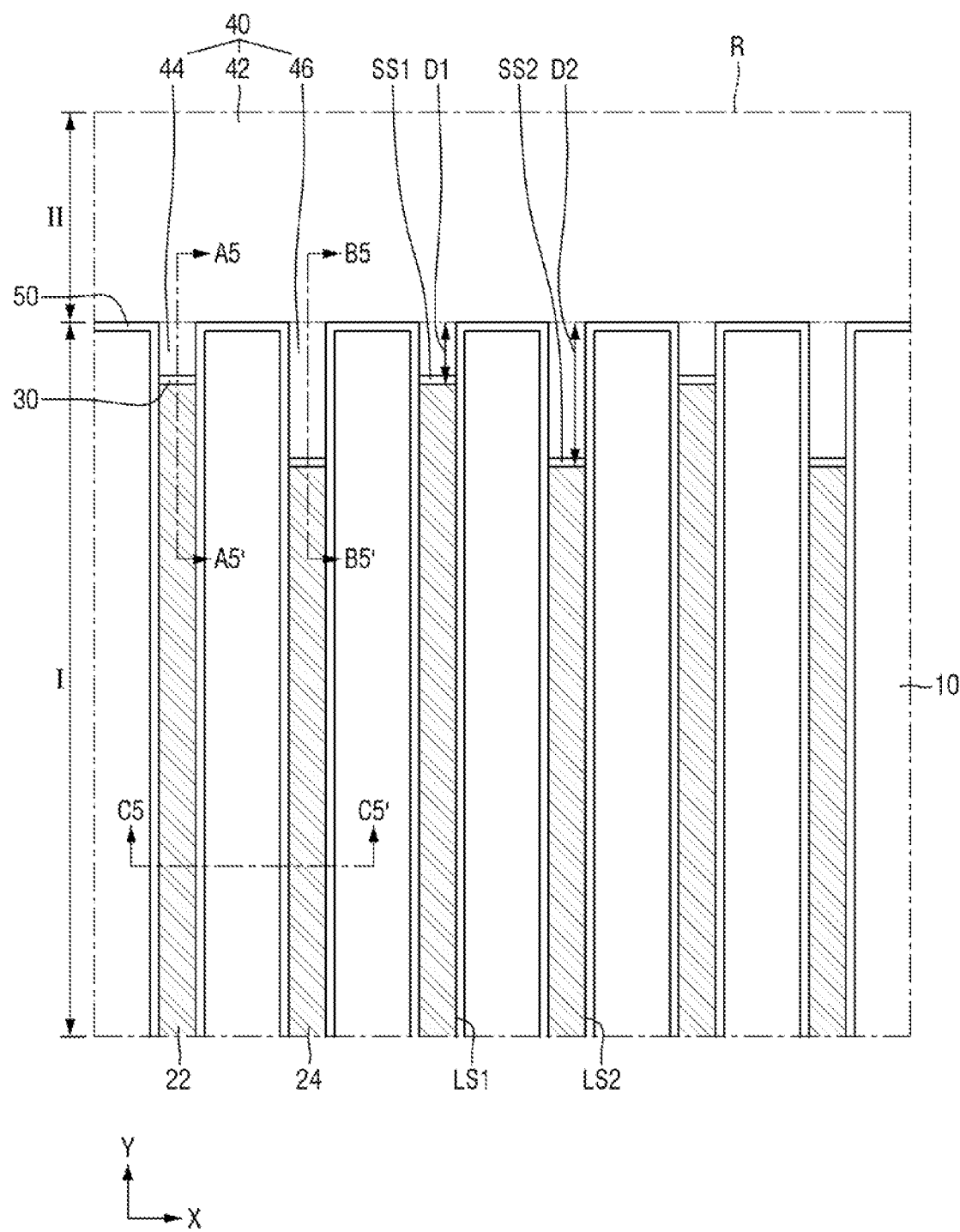
Figure 24:
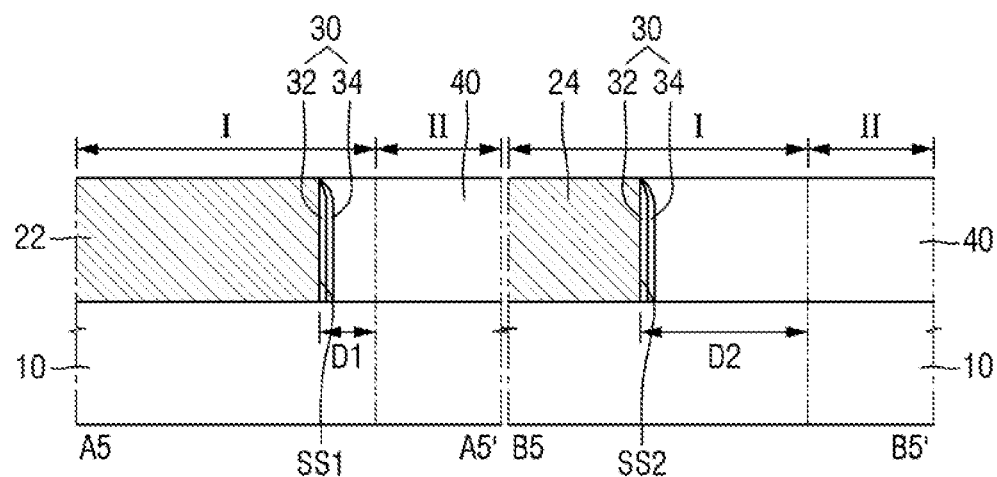
Figure 25:
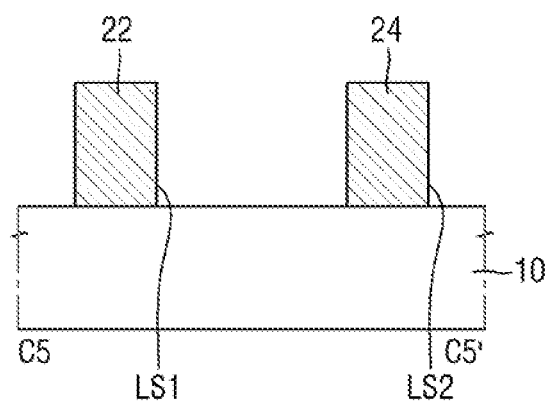

FIG. 12 is a cross-sectional view taken along lines A1-A1' and B1-B1' of FIG. 11, FIG. 13 is a cross-sectional view taken along line C1-C1' of FIG. 11, FIG. 15 is a cross-sectional view taken along lines A2-A2' and B2-B2' of FIG. 14, FIG. 16 is a cross-sectional view taken along line C2-C2' of FIG. 14, FIG. 18 is a cross-sectional view taken along lines A3-A3' and B3-B3' of FIG. 17, FIG. 19 is a cross-sectional view taken along line C3-C3' of FIG. 17, FIG. 21 is a cross-sectional view taken along lines A4-A4' and B4-B4' of FIG. 20, FIG. 22 is a cross-sectional view taken along line C4-C4' of FIG. 20, FIG. 24 is a cross-sectional view taken along lines A5-A5' and B5-B5' of FIG. 23, and FIG. 25 is a cross-sectional view taken along line C5-C5' of FIG. 23.

Figure 10:
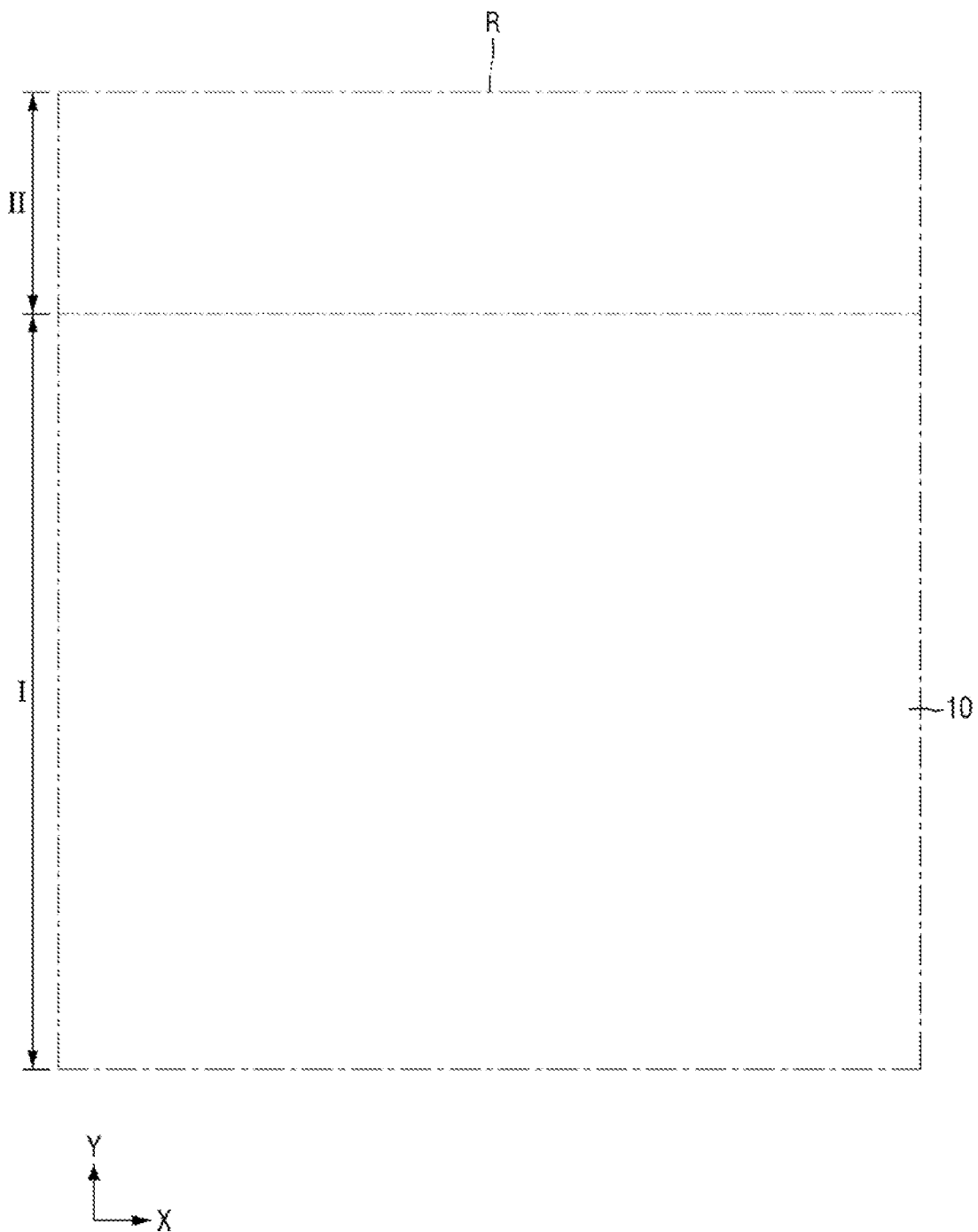
FIGS. 10 through 25 are schematic views of a method of fabricating a semiconductor device according to an exemplary embodiment of the present inventive concept.

Referring to FIG. 10, the substrate 10 including first and second regions I and II may be provided.

The first and second regions I and II of the substrate 10 may be arranged along the first direction Y.

In an exemplary embodiment of the present inventive concept, the first region I of the substrate 10 may be a cell region where semiconductor memory elements are formed, and the second region II of the substrate 10 may be a core/peripheral region which is formed around the cell region. As an example, the second region II may be formed around all four sides of the first region I when viewed in a plan view. Alternatively, the second region II may be formed around less than four sides (e.g., at three sides) of the first region I when viewed in a plan view.

Referring to FIGS. 11 through 13, a conductive structure 20 and the insulating structure 40, which are adjacent to each other, may be formed on the substrate 10. The conductive structure 20 may be formed on the first region I, and the insulating structure 40 may be formed on a part of the first region I and on the second region II.

A sidewall of the conductive structure 20 that is adjacent to the insulating structure 40 may have a concave-convex shape in a plan view. For example, referring to FIG. 11, the conductive structure 20 may include a plurality of conductive protruding portions 20P, which protrude toward the second region II.

A sidewall of the insulating structure 40 that is adjacent to the conductive structure 20 may be in a position corresponding to the sidewall of the conductive structure 20. For example, the sidewall of the insulating structure 40 may have a concave-convex shape corresponding to the shape of the sidewall of the conductive structure 20 in a plan view. For example, referring to FIG. 11, the insulating structure 40 may include a plurality of insulating protruding portions 40P, which protrude toward the first region I.

In an exemplary embodiment of the present inventive concept, the first spacer 30 may be disposed between the conductive structure 20 and the insulating structure 40. Since the sidewall of the conductive structure 20 and the sidewall of the insulating structure 40 both have a concave-convex shape, the first spacer 30 may also have a concave-convex shape in a plan view.

In an exemplary embodiment of the present inventive concept, the first spacer 30 may include multiple films. For example, referring to FIG. 12, the first spacer 30 may include the first sub-spacer 32, which is in direct contact with the conductive structure 20, and the second sub-spacer 34, which is disposed on a sidewall of the first sub-spacer 32. For example, the first sub-spacer 32 may include silicon nitride, and the second sub-spacer 34 may include silicon oxide. However, exemplary embodiments of the present inventive concept are not limited thereto.

Referring to FIGS. 14 through 16, sacrificial patterns SM and first mask patterns M1 may be formed on the conductive structure 20 and the insulating structure 40.

For example, the sacrificial patterns SM, which partially expose the conductive structure 20 and extend in the first direction Y, may be formed on the conductive structure 20 and the insulating structure 40. The sacrificial patterns SM may be formed to partially overlap with the conductive protruding portions 20P.

The sacrificial patterns SM may include, for example, a spin-on-hardmask (SOH) film.

The first mask patterns M1 may extend along sidewalls of the sacrificial patterns SM. The first mask patterns M1 may be formed using, for example, double patterning technology (DPT). For example, the first mask patterns M1, which extend along the sidewalls of the sacrificial patterns SM, may be formed by forming a mask material on the sacrificial patterns SM and partially etching the mask material.

The first mask patterns M1 may include, for example, a photoresist material.

In an exemplary embodiment of the present inventive concept, the first mask patterns M1 may include first mask lines M1a, which extend in the first direction Y, and second mask lines M1b, which also extend in the first direction Y. The first mask lines M1a may partially overlap with the conductive protruding portions 20P, but the second mask lines M1b might not overlap with the conductive protruding portions 20P.

Referring to FIGS. 17 through 19, the sacrificial patterns SM may be removed.

As a result, the conductive structure 20 may be exposed between the first mask lines M1a and the second mask lines M1b.

Referring to FIGS. 20 through 22, a second mask pattern M2 may be formed on the second region II.

The second mask pattern M2 may be formed to at least partially cover the second region II of the substrate 10. In an exemplary embodiment of the present inventive concept, the second mask pattern M2 might not overlap with the conductive structure 20.

For example, the second mask pattern M2 may be formed on the insulating structure 40 on the second region II and on parts of the first mask patterns M1 on the second region II. As a result, the insulating structure 40, which is formed on the first region I of the substrate 10, may be partially exposed.

The second mask pattern M2 may include, for example, a photoresist material.

Referring to FIGS. 23 through 25, the conductive structure 20 and the insulating structure 40 may be patterned using the first mask patterns M1 and the second mask pattern M2.

The conductive structure 20 may be patterned into first conductive patterns 22, which extend in the first direction Y, and second conductive patterns 24, which also extend in the first direction Y and are spaced apart from the first conductive patterns 22 (e.g., in the second direction X). The first conductive patterns 22 may be parts of the conductive structure 20 that are patterned by the first mask lines M1a of the first mask patterns M1, and the second conductive patterns 24 may be parts of the conductive structure 20 that are patterned by the second mask lines M1b of the first mask patterns M1.

Since the first mask lines M1a may overlap with the conductive protruding portions 20P of the conductive structure 20, the first conductive patterns 22 may include parts of the conductive protruding portions 20P. For example, the first distance D1 between the first conductive patterns 22 and the second region II may be smaller than the second distance D2 between the second conductive patterns 24 and the second region II.

The insulating structure 40 may be patterned into the flat portion 42, first protruding portions 44, and second protruding portions 46.

The flat portion 42 of the insulating structure 40 may be a part of the insulating structure 40 that is patterned by the second mask pattern M2. Accordingly, the flat portion 42 may be disposed on the second region II of the substrate 10. A sidewall of the flat portion 42 may be formed along the boundary between the first and second regions I and II.

The first protruding portions 44 of the insulating structure 40 may be parts of the insulating structure 40 that are patterned by the first mask lines M1a of the first mask patterns M1. Accordingly, the first protruding portions 44 may protrude from the sidewall of the flat portion 42 in the first direction Y. The first protruding portions 44 may be disposed between the flat portion 42 and the first conductive patterns 22.

The second protruding portions 46 of the insulating structure 40 may be parts of the insulating structure 40 that are patterned by the second mask lines M1b of the first mask patterns M1. Accordingly, the second protruding portions 46 may be spaced apart from the first protruding portions 44 and may protrude from the flat portion 42 in the first direction Y. The second protruding portions 46 may be disposed between the flat portion 42 and the second conductive patterns 24.

Referring to FIGS. 2 through 4, the second spacer 50 may be formed on the sidewall of the insulating structure 40, sidewalls of each of the first conductive patterns 22, and sidewalls of each of the second conductive patterns 24.

Accordingly, the second spacer 50 may be formed between the first conductive patterns 22 and the second conductive patterns 24 to extend along the sidewalls of each of the first conductive patterns 22, sidewalls of each of the first protruding portions 44, the sidewall of the flat portion 42, sidewalls of each of the second protruding portions 46, and the sidewalls of each of the second conductive patterns 24.

In an exemplary embodiment of the present inventive concept, the second spacer 50 may include multiple films. For example, the second spacer 50 may include the third sub-spacer 52, which is in direct contact with the first conductive patterns 22 and the second conductive patterns 24, and a fourth sub-spacer 54, which is disposed on sidewalls of the third sub-spacer 52. For example, the third sub-spacer 52 may include silicon nitride, and the fourth sub-spacer 54 may include silicon oxide. However, exemplary embodiments of the present inventive concept are not limited thereto.

In a case where the second mask pattern M2, which protects the second region II, is used in the process of patterning the first conductive patterns 22 and the second conductive patterns 24 on the first region I, bridges may be formed to connect the ends of the first conductive patterns 22 and the ends of the second conductive patterns 24 (e.g., due to current limitations on a resolution of photolithography).

For example, due to misalignment, the second mask pattern M2 may be formed to be closer to the conductive structure 20 than is desired, or to overlap with the conductive structure 20, in which case, bridges may be formed after patterning connecting the first conductive patterns 22 and the second conductive patterns 24.

However, in a method of fabricating a semiconductor device according to an exemplary embodiment of the present inventive concept, the formation of bridges can be reduced or eliminated using the conductive protruding portions 20P, and as a result, a process margin can be increased. For example, manufacturing costs may be reduced, manufacturing yield may be increased, and an occurrence rate of errors or defects in a semiconductor device according to an exemplary embodiment of the present inventive concept may be reduced.

FIGS. 26 through 38 are schematic views of a method of fabricating a semiconductor device according to an exemplary embodiment of the present inventive concept. Descriptions of components that are the same or substantially the same as those described above with reference to FIGS. 1 through 25 above may be omitted below.

Figure 26:
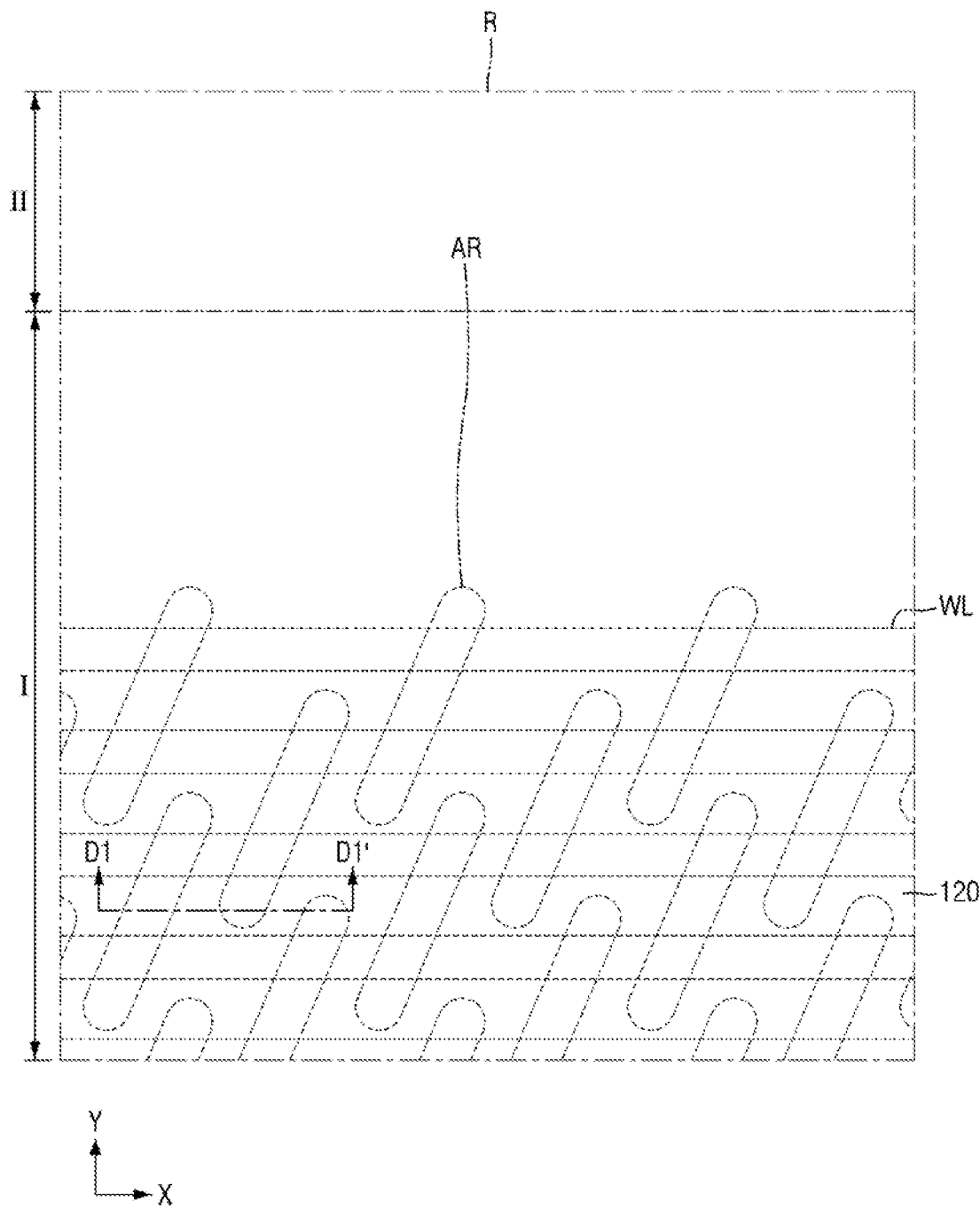
FIGS. 26 through 38 are schematic views of a method of fabricating a semiconductor device according to an exemplary embodiment of the present inventive concept.
Figure 27:
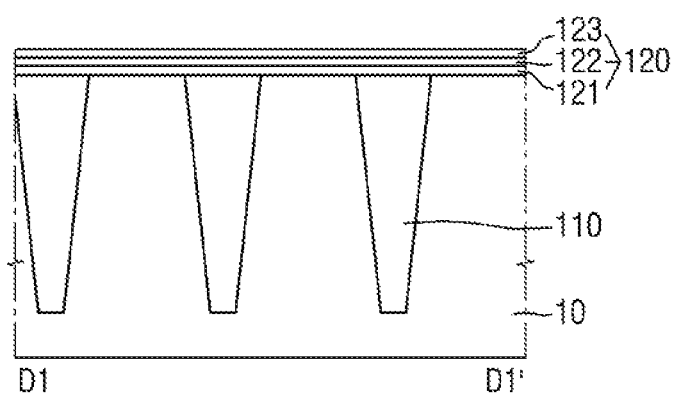
Figure 28:
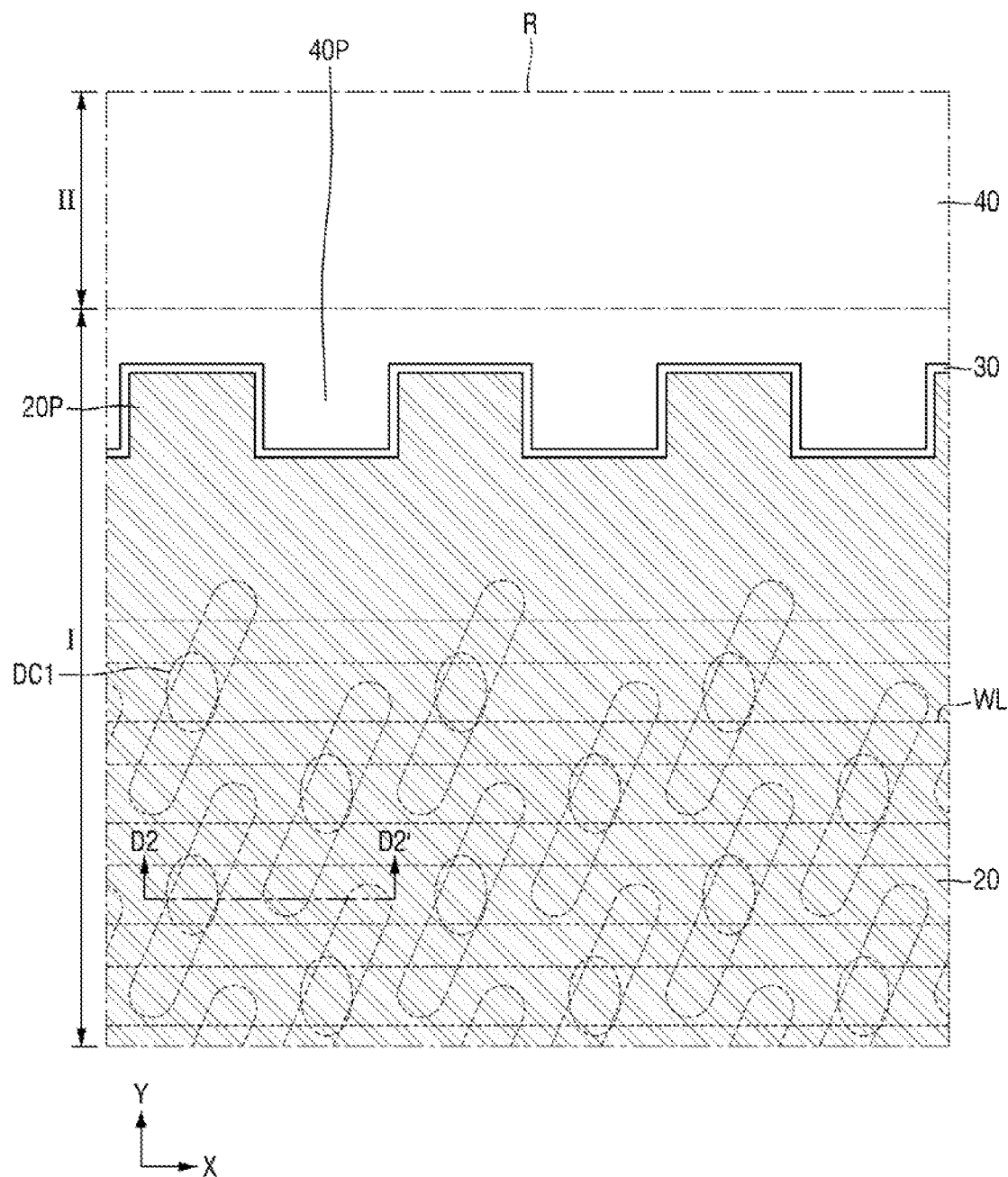
Figure 29:
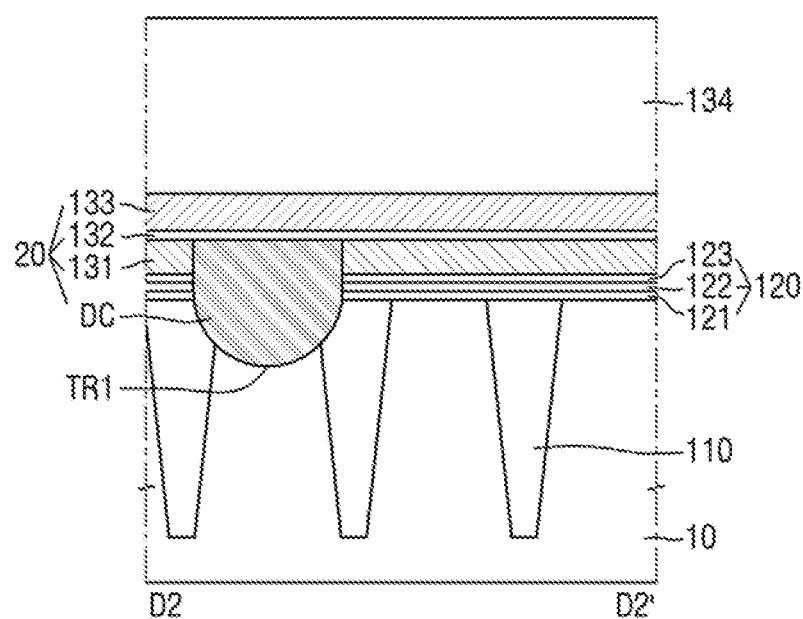
Figure 30:
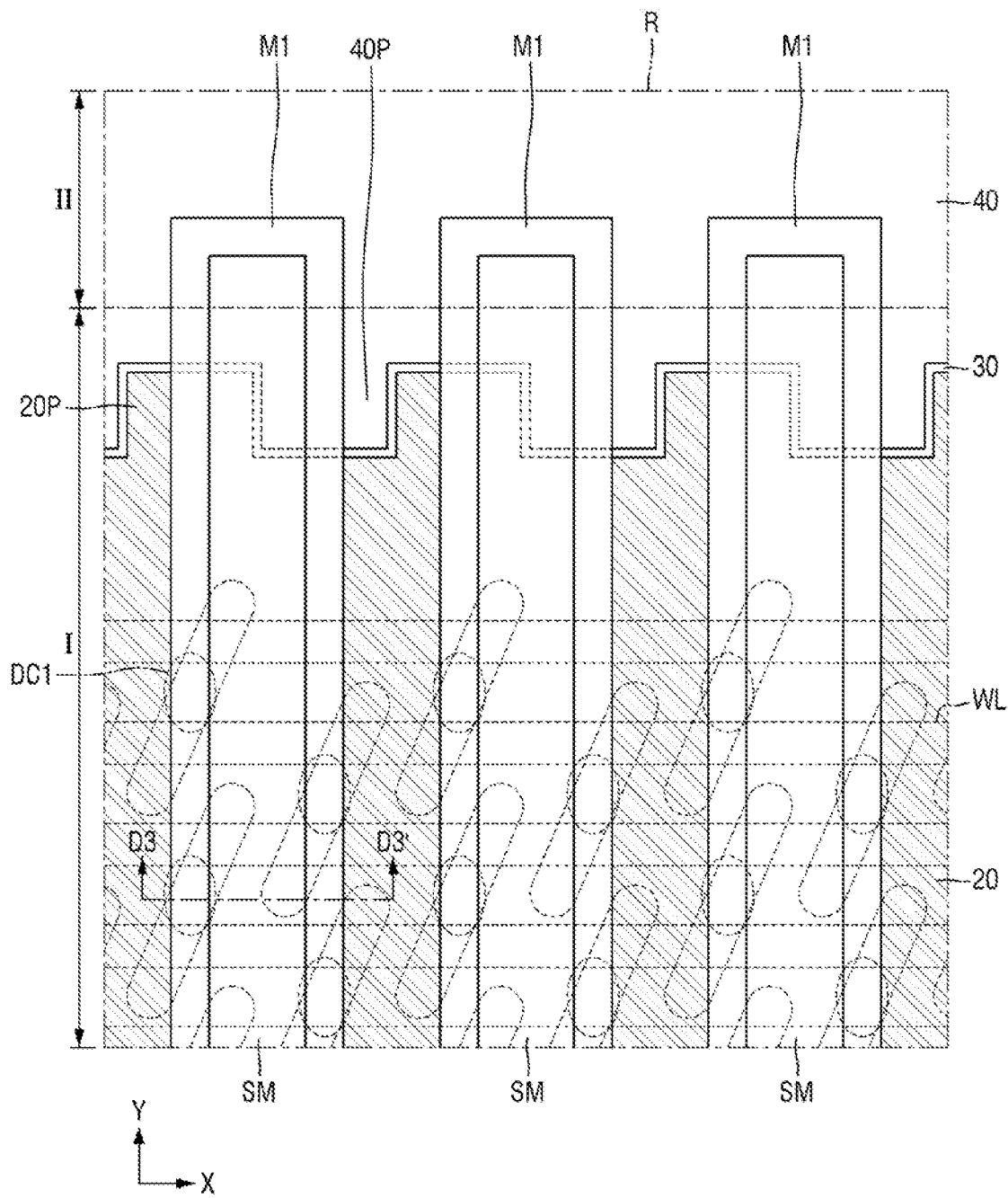
Figure 31:
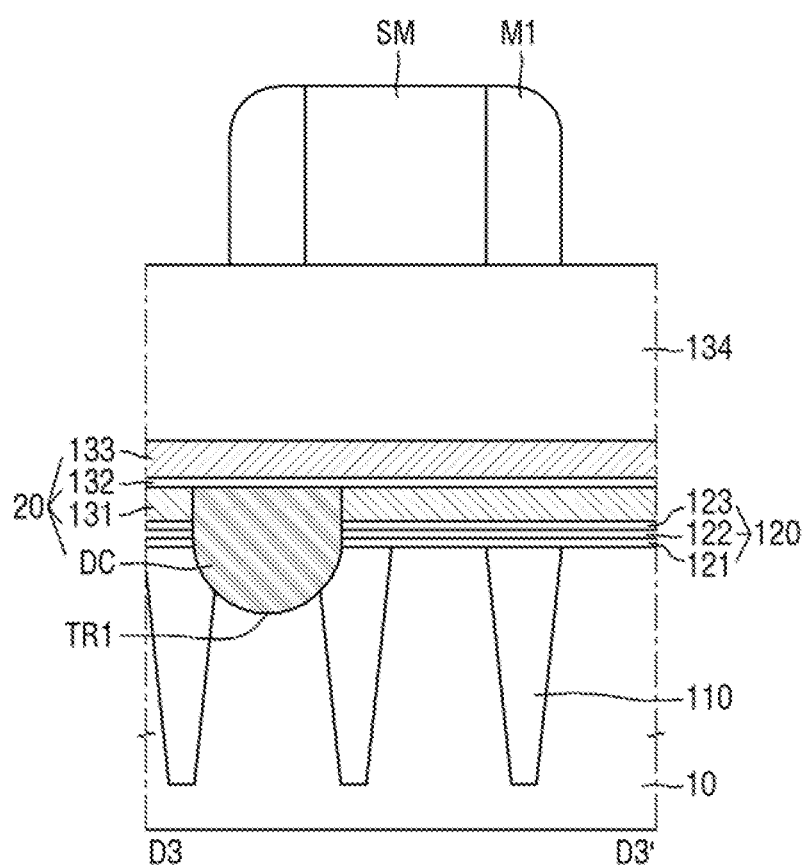
Figure 32:
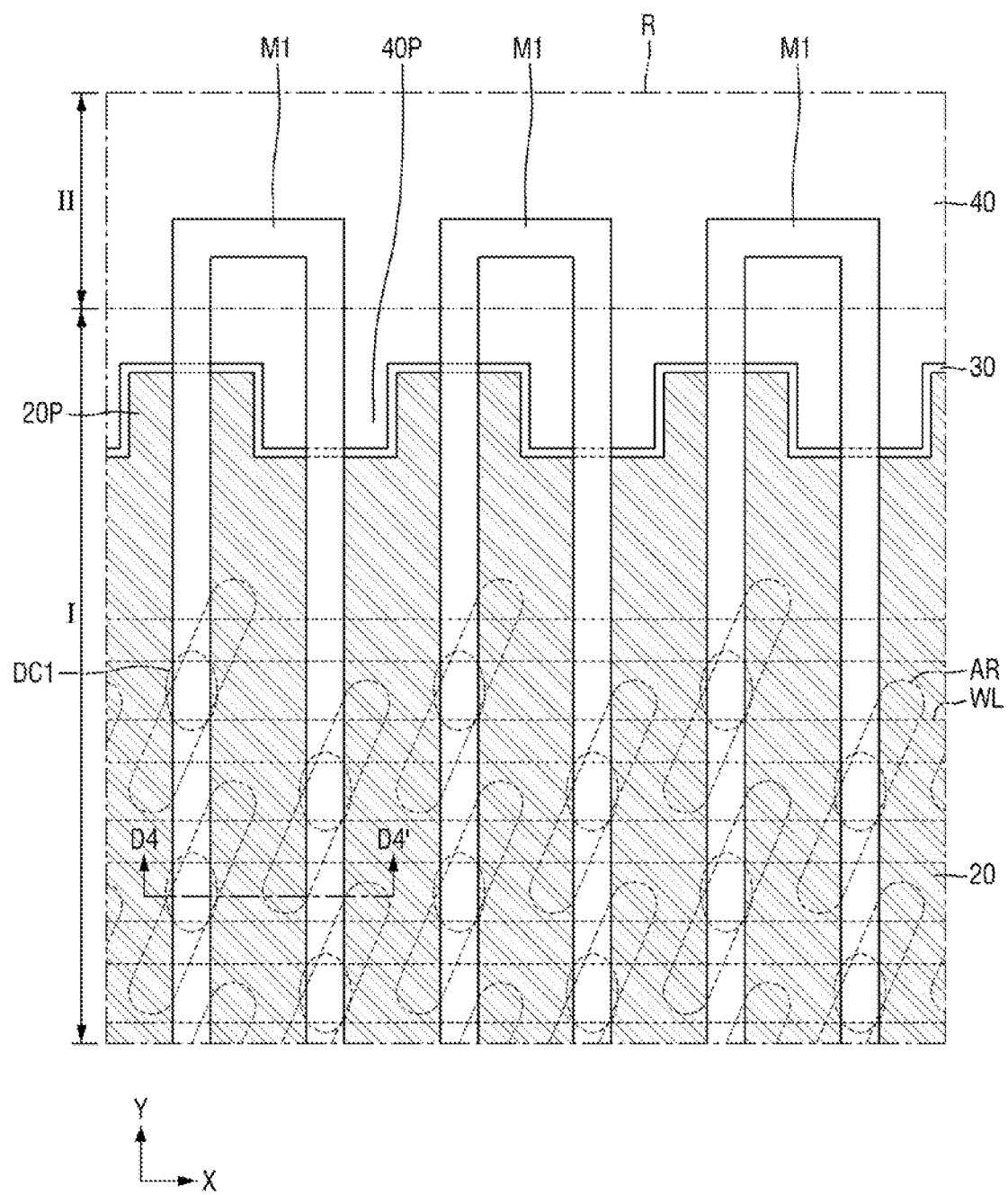
Figure 33:
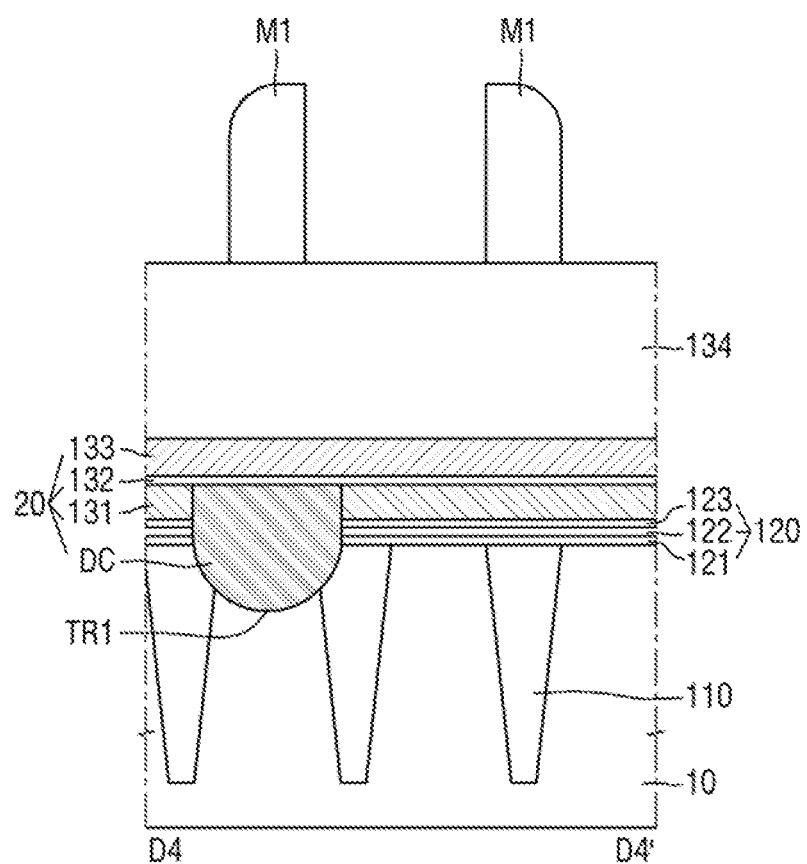
Figure 35:
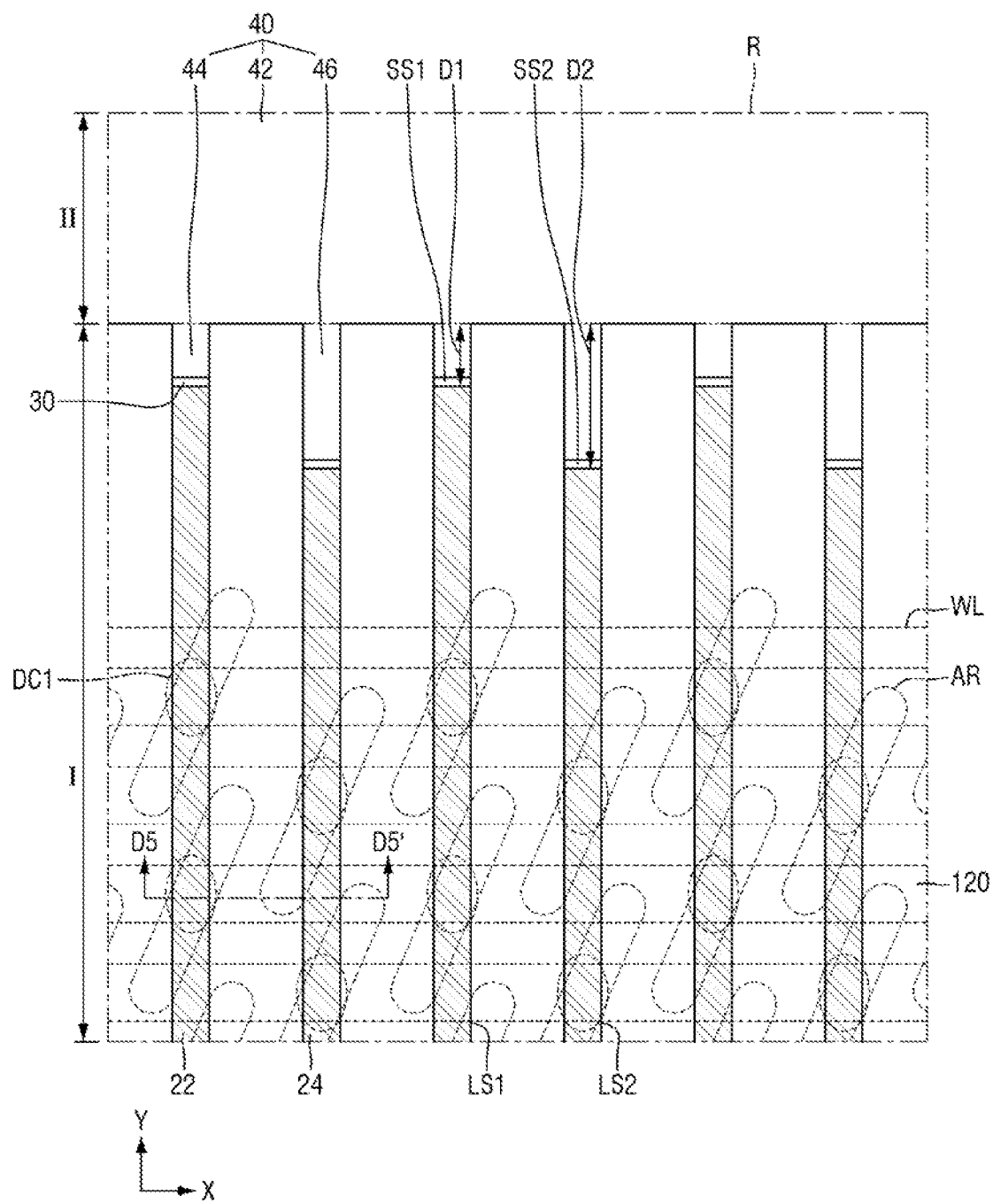
Figure 36:
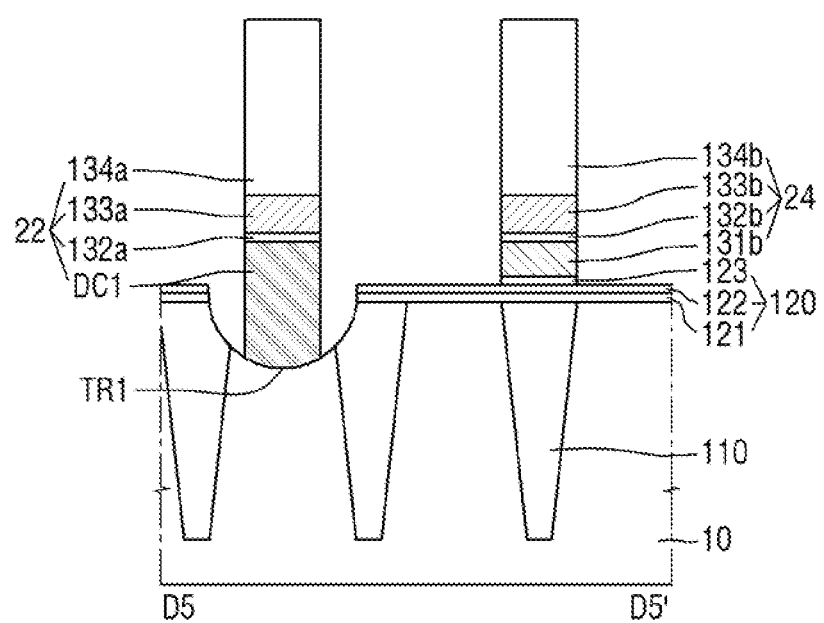
Figure 37:
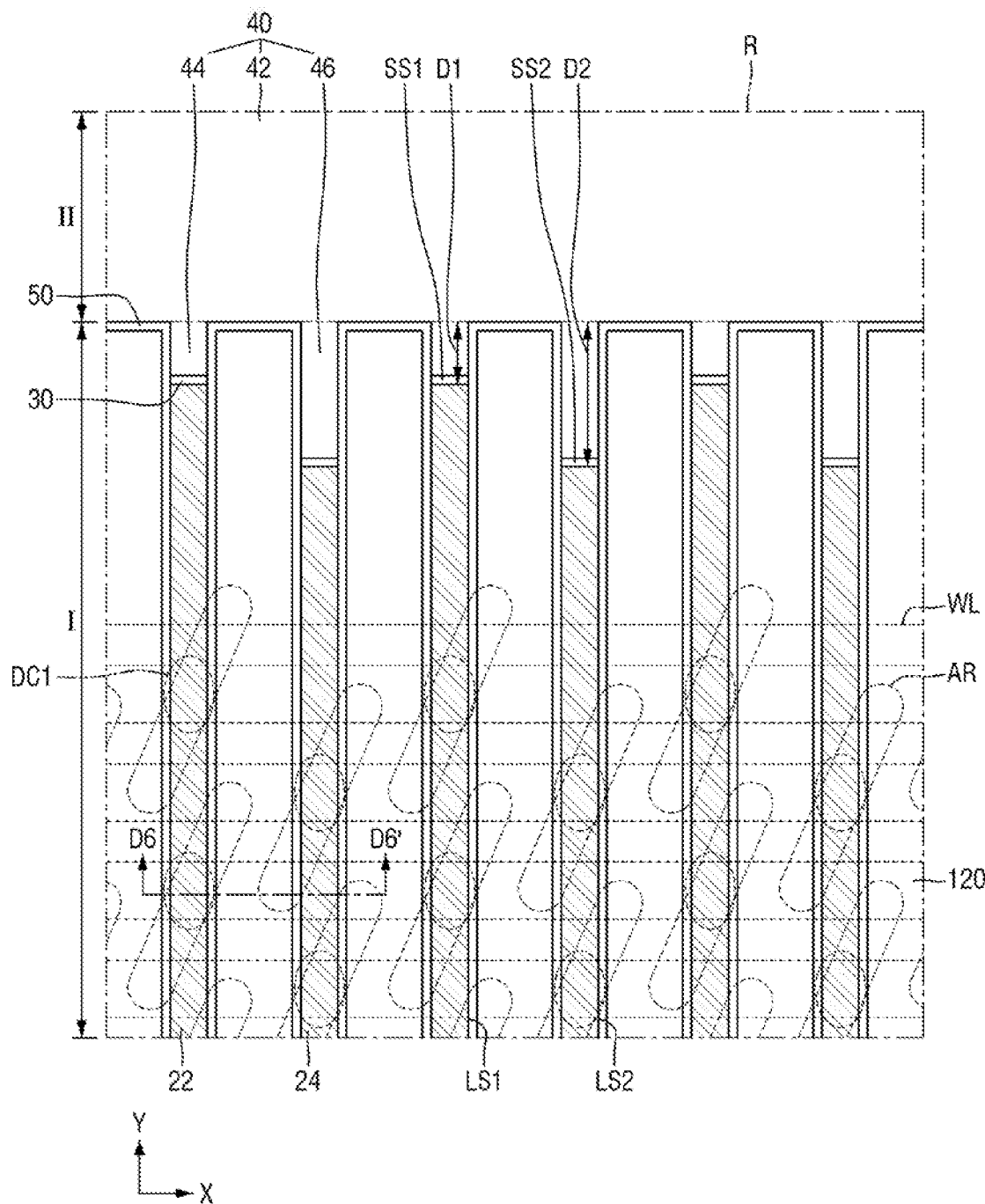
Figure 38:
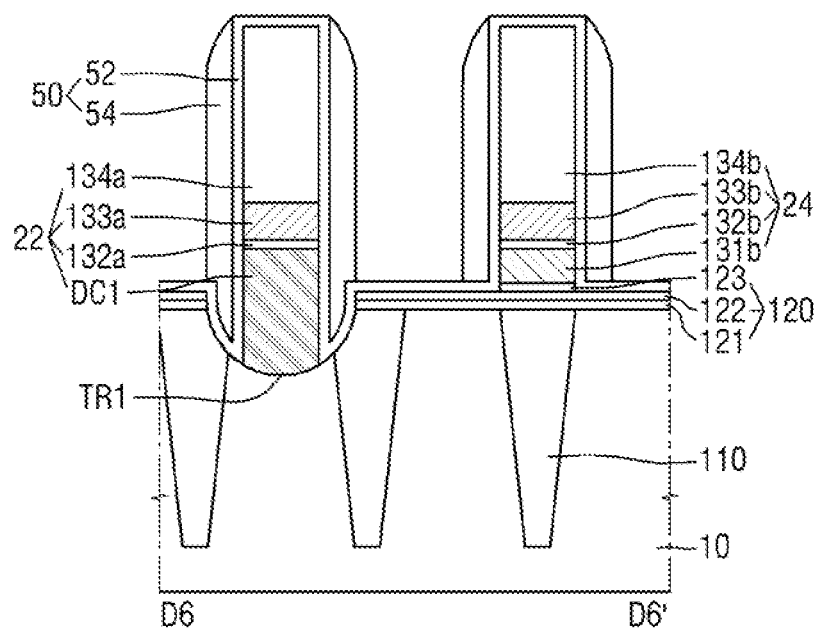

FIG. 27 is a cross-sectional view taken along line D1-D1' of FIG. 26, FIG. 29 is a cross-sectional view taken along line D2-D2' of FIG. 28, FIG. 31 is a cross-sectional view taken along line D3-D3' of FIG. 30, FIG. 33 is as cross-sectional view taken along line D4-D4' of FIG. 32, FIG. 36 is a cross-sectional view taken along line D5-D5' of FIG. 35, and FIG. 38 is a cross-sectional view taken along line D6-D6' of FIG. 37.

Referring to FIGS. 26 and 27, the substrate 10 including active regions AR, word lines WL, the isolation film 110, and the insulating film 120 may be provided.

The active regions AR may be formed in the substrate 10. The active regions AR may be formed as diagonal bars (e.g., diagonal with respect to the first and second directions Y and X). For example, the active regions AR may be formed on a plane (e.g., above an upper surface of the substrate 10) defined by first and second directions Y and X as bars extending in an angled direction with respect to the first and second directions Y and X that is neither the first direction Y nor the second direction X. The active regions AR may be formed as multiple bars extending in parallel to one another. Alternatively, some of the active regions AR may extend at different angles from each other with respect to the first and second direction Y and X. For example, some of the active regions AR may extend in parallel with the first or second directions Y and X. The centers of the active regions AR may be disposed adjacent to the ends of their respective neighboring active regions AR.

The isolation film 110 may define the active regions AR. Referring to FIG. 27, sidewalls of the isolation film 110 may be inclined, but exemplary embodiments of the present invention are not limited thereto.

The insulating film 120 may be formed on the substrate 10 and the isolation film 110. The insulating film 120 may include a single-layer film or may be a multilayer film including first, second, and third insulating films 121, 122, and 123 (see, e.g., FIG. 6A).

Referring to FIGS. 28 and 29, the conductive structure 20 and the insulating structure 40, which are adjacent to each other, may be formed on the substrate 10. The formation of the conductive structure 20 and the insulating structure 40 is similar to the formation of the conductive structure 20 and the insulating structure 40 described in more detail above with reference to FIGS. 11 through 13, and thus, duplicative descriptions may be omitted below.

In an exemplary embodiment of the present inventive concept, the conductive structure 20 may include multiple films. For example, the conductive structure 20 may include the first conductive film 131, the second conductive film 132, the third conductive film 133, and the capping film 134, which are sequentially stacked on the substrate 10.

For example, the first conductive film 131 may include polysilicon, the second conductive film 132 may include a conductive metal nitride (for example, TiSiN), the third conductive film 133 may include a metal (for example, W), and the capping film 134 may include silicon nitride. However, exemplary embodiments of the present invention are not limited thereto.

In an exemplary embodiment of the present inventive concept, the conductive structure 20 may include a plurality of first direct contacts DC1.

The first direct contacts DC1 may be formed below the conductive structure 20. For example, the first direct contacts DC1 may be formed in first trenches TR1 in the substrate 10. Accordingly, the first direct contacts DC1 may be in direct contact with the substrate 10. For example, the first direct contacts DC1 may be in direct contact with central parts of the active regions AR that are exposed by the first trenches TR1.

The first direct contacts DC1 may include a conductive material. Accordingly, some of the first or second conductive patterns 22 or 24 may be electrically connected to the active regions AR.

Referring to FIGS. 30 and 31, sacrificial patterns SM and first mask patterns M1 may be formed on the conductive structure 20 and the insulating structure 40. The formation of the sacrificial patterns SM and the first mask patterns M1 is similar to the formation of the sacrificial patterns SM and the first mask patterns M1 described in more detail above with reference to FIGS. 14 through 16, and thus, duplicative descriptions may be omitted below.

In an exemplary embodiment of the present inventive concept, the first mask patterns M1 may be formed to overlap with the first direct contacts DC1 of the conductive structure 20.

Referring to FIGS. 32 and 33, the sacrificial patterns SM may be removed. The removal of the sacrificial patterns SM is similar to the removal of the sacrificial patterns SM described in more detail above with reference to FIGS. 17 through 19, and thus, duplicative descriptions may be omitted below.

Figure 34:
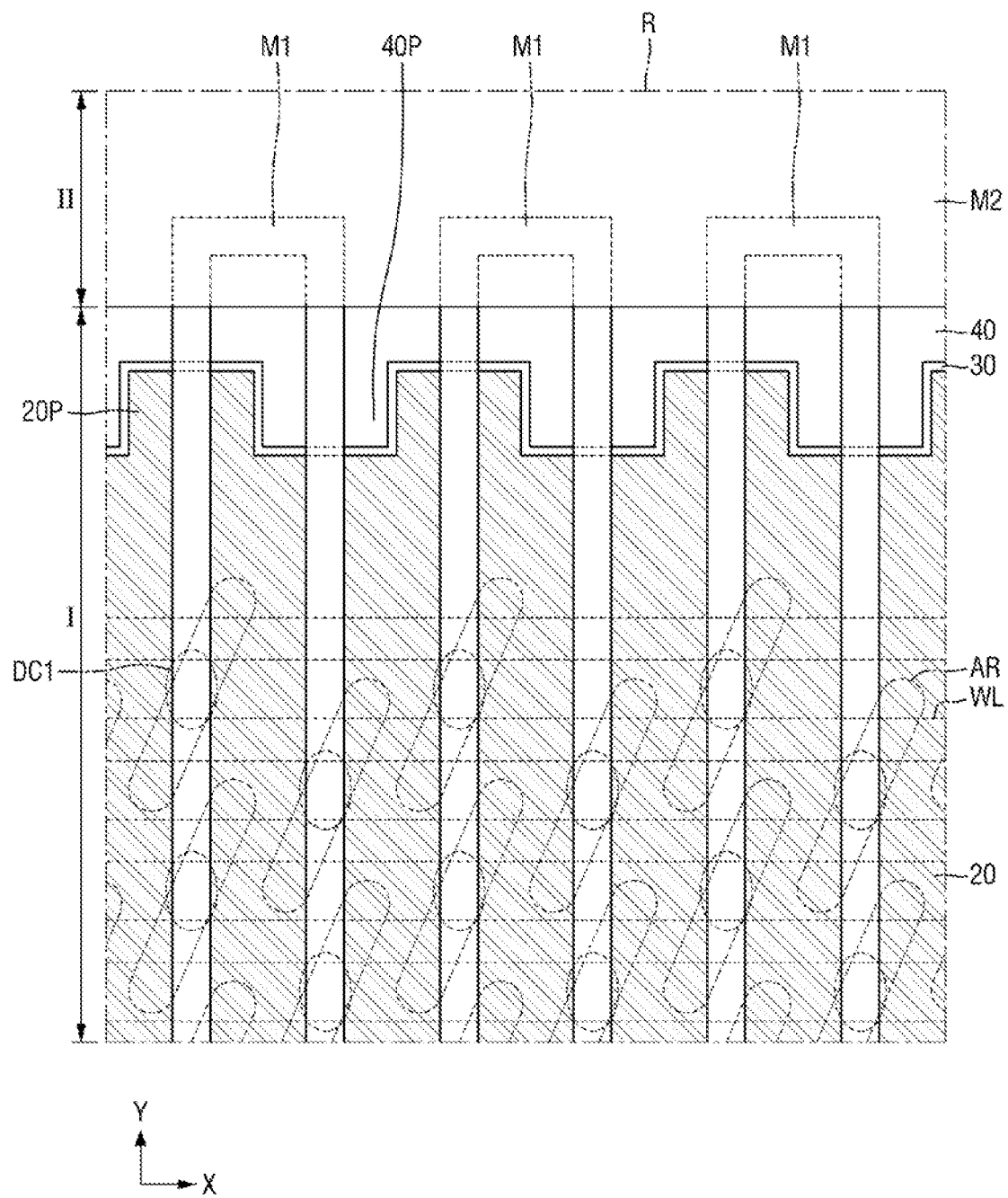

Referring to FIG. 34, the second mask pattern M2 may be formed in the second region II. The formation of the second mask pattern M2 is similar to the formation of the second mask pattern M2 described in more detail above with reference to FIGS. 20 through 22, and thus, duplicative descriptions may be omitted below.

The second mask pattern M2 may be formed to cover the second region II of the substrate 10, but not the first region I of the substrate 10. Accordingly, the second mask pattern M2 may expose a part of the insulating structure 40, the first spacer 30, and the conductive structure 20.

Referring to FIGS. 35 and 36, the conductive structure 20 and the insulating structure 40 may be patterned using the first mask patterns M1 and the second mask pattern M2. The patterning of the conductive structure 20 and the insulating structure 40 is similar to the patterning of the conductive structure 20 and the insulating structure 40 described in more detail above with reference to FIGS. 23 through 25, and thus, duplicative descriptions may be omitted below.

Accordingly, first conductive patterns 22 and second conductive patterns 24, including the first direct contacts DC1, may be formed.

In an exemplary embodiment of the present inventive concept, the second conductive patterns 24 may at least partially overlap with second direct contacts DC2. For example, ends of the second conductive patterns 24 that are adjacent to the second region 11 (e.g., that face the second region II) may overlap, in the second direction X, with the second direct contacts DC2 that are adjacent to the second region II.

Thereafter, referring to FIGS. 5 through 7, the second spacer 50 may be formed on a sidewall of the insulating structure 40, sidewalls of each of the first conductive patterns 22, and sidewalls of each of the second conductive patterns 24. The formation of the second spacer 50 is similar to the formation of the second spacer 50 described in more detail above with reference to FIGS. 2 through 4, and thus, duplicative descriptions may be omitted below.

Figure 39:
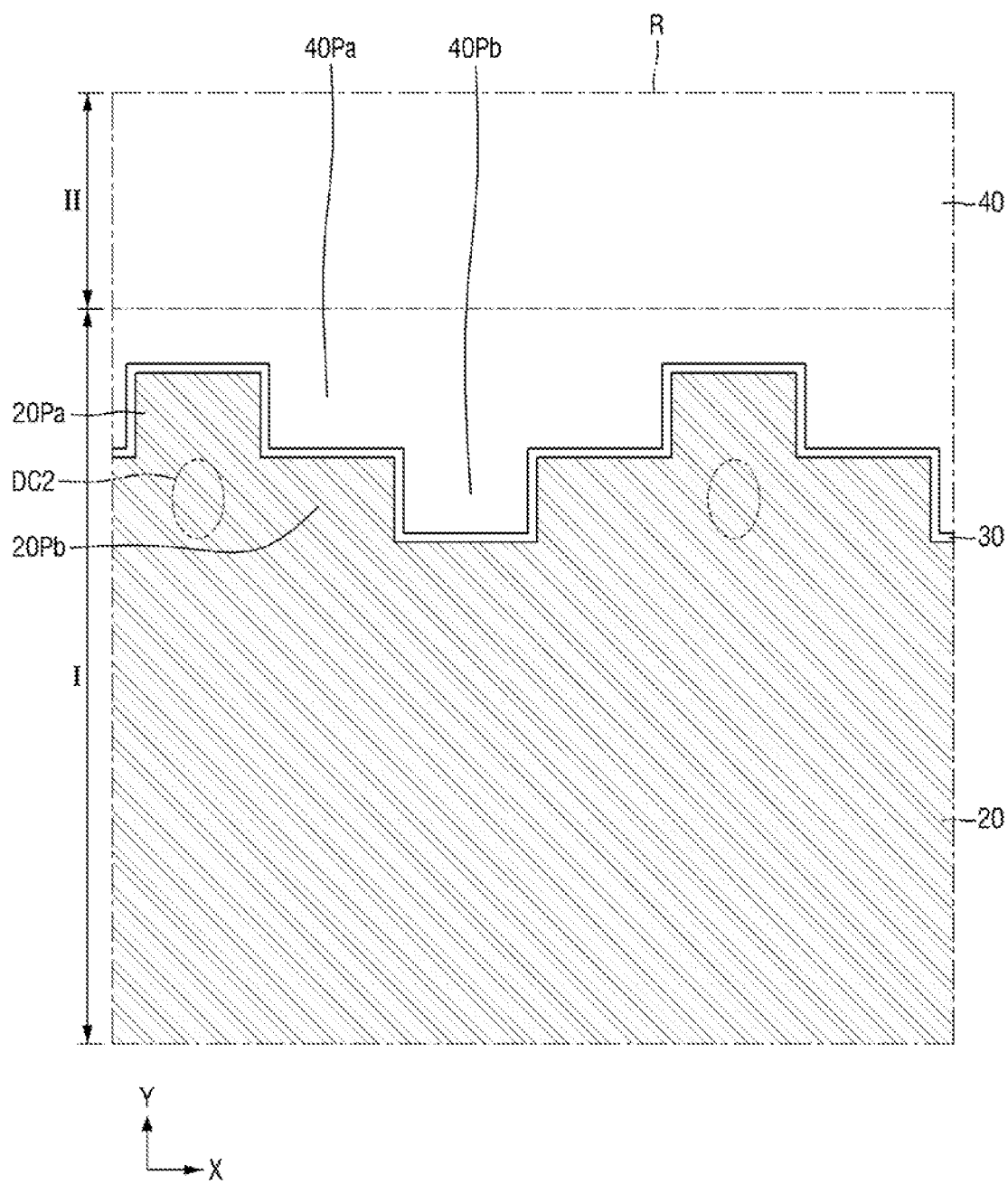
FIG. 39 is a schematic view illustrating an intermediate step of a method of fabricating a semiconductor device according to an exemplary embodiment of the present inventive concept.

FIG. 39 is a schematic view illustrating an intermediate step of a method of fabricating a semiconductor device according to an exemplary embodiment of the present inventive concept. Descriptions of components that are the same or substantially the same as those described above with reference to FIGS. 1 through 38 above may be omitted.

For example, FIG. 39 illustrates steps performed after the steps described above with reference to FIG. 10.

Referring to FIG. 39, the conductive structure 20 and the insulating structure 40, which are adjacent to each other, may be formed on a substrate 10.

In an exemplary embodiment of the present inventive concept, a sidewall of the conductive structure 20 that is adjacent to the insulating structure 40 may have a stepped shape in a plan view. For example, referring to FIG. 39, the conductive structure 20 may include first conductive protruding portions 20Pa, which protrude toward the second region II of the substrate 10, and second conductive protruding portions 20Pb, which also protrude toward the second region II of the substrate 10.

The first conductive protruding portions 20Pa and the second conductive protruding portions 20Pb may be adjacent to one another. The first conductive protruding portions 20Pa may extend closer to the second region II than the second conductive protruding portions 20Pb.

A sidewall of the insulating structure 40 that is adjacent to the conductive structure 20 may correspond to the sidewall of the conductive structure 20. For example, the sidewall of the insulating structure 40 may have a stepped shape corresponding to the shape of the sidewall of the conductive structure 20 in a plan view. For example, referring to FIG. 39, the insulating structure 40 may include first insulating protruding portions 40Pa, which protrude from the second region II into the first region I of the substrate 10, and second insulating protruding portions 40Pb, which also protrude from the second region II into the first region I.

Thereafter, steps similar to those described above with reference to FIGS. 14 through 25 may be performed. As a result, referring to FIG. 8, a semiconductor device including the first conductive patterns 22, the second conductive patterns 24, and third conductive patterns 26 may be formed.

In an exemplary embodiment of the present inventive concept, the distance between the third conductive patterns 26 and the second region II may be greater than the distance between the second conductive patterns 24 and the second region II. For example, the third distance D3 between the third conductive patterns 26 and the second region II may be greater than the second distance D2 between the second conductive patterns 24 and the second region II.

Figure 40:
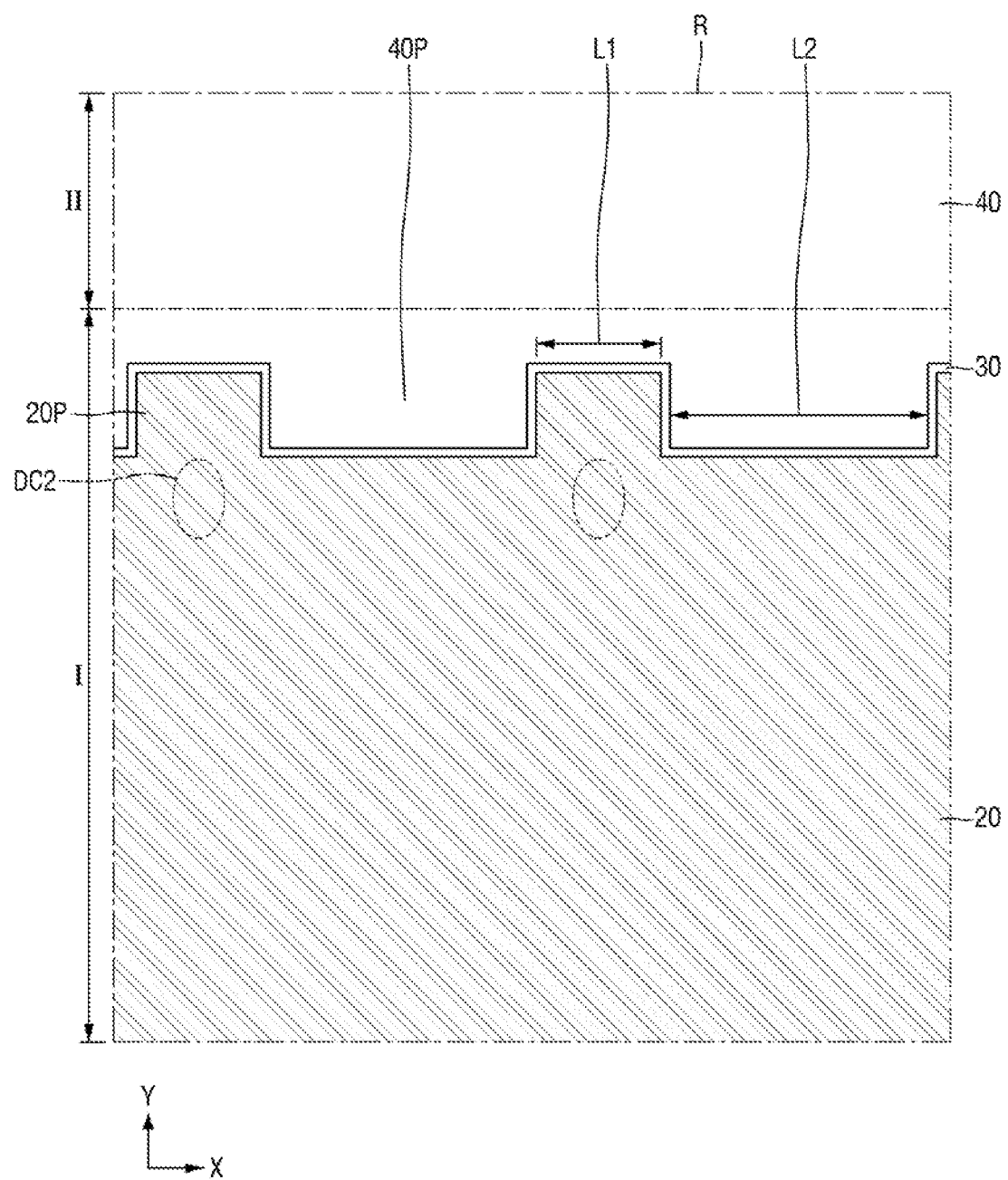
FIG. 40 is a schematic view illustrating an intermediate step of a method of fabricating a semiconductor device according to an exemplary embodiment of the present inventive concept.

FIG. 40 is a schematic view illustrating an intermediate step of a method of fabricating a semiconductor device according to an exemplary embodiment of the present inventive concept. Descriptions of components that are the same or substantially the same as those described above with reference to FIGS. 1 through 38 above may be omitted.

For example, FIG. 40 illustrates steps performed after the steps described above with reference to FIG. 10.

Referring to FIG. 40, the conductive structure 20 and the insulating structure 40, which are adjacent to each other, may be formed on a substrate 10.

In an exemplary embodiment of the present inventive concept, a sidewall of the conductive structure 20 that is adjacent to the insulating structure 40 may have a concave-convex shape in a plan view. For example, referring to FIG. 40, the conductive structure 20 may include conductive protruding portions 20P, which protrude toward the second region II of the substrate 10.

A sidewall of the insulating structure 40 that is adjacent to the conductive structure 20 may be in a position corresponding to the sidewall of the conductive structure 20. For example, the sidewall of the insulating structure 40 may have a concave-convex shape corresponding to the shape of the sidewall of the conductive structure 20 in a plan view. For example, referring to FIG. 40, the insulating structure 40 may include insulating protruding portions 40P, which protrude from the second region into the first region I of the substrate 10.

In an exemplary embodiment of the present inventive concept, the length by which the conductive protruding portions 20P extend in the second direction X may differ from the length by which the insulating protruding portions 40P extend in the second direction X. For example, referring to FIG. 40, a first length L1 by which the conductive protruding portions 20P extend in the second direction X may be smaller than a second length L2 by which the insulating protruding portions 40P extend in the second direction X.

Thereafter, steps similar to those described above with reference to FIGS. 14 through 25 may be performed. As a result, referring to FIG. 9, a semiconductor device including first conductive patterns 22, second conductive patterns 24, and third conductive patterns 26 may be formed.

In an exemplary embodiment of the present inventive concept, the distance between the third conductive patterns 26 and the second region II may be substantially the same as the distance between the second conductive patterns 24 and the second region II. For example, a third distance D3 between the third conductive patterns 26 and the second region II may be substantially the same as a second distance D2 between the second conductive patterns 24 and the second region II.

While the present inventive concept has been particularly shown and described with reference to exemplary embodi-

What is claimed is:

1. A semiconductor device comprising:
   a substrate including first and second regions, which are arranged along a first direction;
   an insulating structure including a flat portion, which is disposed on the second region, and a protruding portion, which protrudes from a sidewall of the flat portion in the first direction,
   a first conductive pattern including a first long side, which extends in the first direction, and a first short side, which extends in a second direction intersecting the first direction, on the first region;
   a second conductive pattern including a second long side, which extends in the first direction and faces the first long side of the first conductive pattern, and a second short side, which extends in the second direction and faces the protruding portion, on the first region;
   a first spacer extending between the protruding portion and the second conductive pattern along the second short side of the second conductive pattern;
   a second spacer extending along the first long side of the first conductive pattern, the second long side of the second conductive pattern, a sidewall of the protruding portion, and the sidewall of the flat portion; and
   a direct contact connected to the first conductive pattern and overlapping with the protruding portion in the second direction,
   wherein a distance between the first conductive pattern and the second region is smaller than a distance between the second conductive pattern and the second region.

2. The semiconductor device of claim 1, wherein the first spacer includes a plurality of sub-spacers, which have different materials from each other.

3. The semiconductor device of claim 2, wherein the plurality of sub-spacers includes a first sub-spacer, which is in direct contact with the second short side of the second conductive pattern, and a second sub-spacer, which is disposed on a sidewall of the first sub-spacer,
   the first sub-spacer includes silicon nitride, and
   the second sub-spacer includes silicon oxide.

4. The semiconductor device of claim 1, wherein the second spacer includes a plurality of sub-spacers, which have different materials from each other.

5. The semiconductor device of claim 4, wherein the plurality of sub-spacers include a first sub-spacer, which is in direct contact with the first long side of the first conductive pattern and the second long side of the second conductive pattern, and a second sub-spacer, which is disposed on a sidewall of the first sub-spacer,
   the first sub-spacer includes silicon nitride, and
   the second sub-spacer includes silicon oxide.

6. The semiconductor device of claim 1, wherein, in the second direction, a width of the protruding portion is substantially the same as a width of the second conductive pattern.

7. The semiconductor device of claim 1, wherein a top surface of the insulating structure, a top surface of the first conductive pattern, and a top surface of the second conductive pattern are disposed substantially on a same plane as each other.

8. The semiconductor device of claim 1, wherein each of the first conductive pattern and the second conductive pattern includes a first conductive film, a second conductive film, and a third conductive film, which are sequentially stacked on the substrate,
   the first conductive film includes polysilicon,
   the second conductive film includes a conductive metal nitride, and
   the third conductive film includes a metal.

9. The semiconductor device of claim 1, further comprising:
   an active region in the first region of the substrate, a first portion of the active region is connected to the first conductive pattern or the second conductive pattern;
   a capacitor connected to a second portion of the active region; and
   a word line extending in the second direction across the active region between the first portion of the active region and the second portion of the active region.

10. The semiconductor device of claim 1, wherein at least a part of the second spacer overlaps with the direct contact in the second direction.

11. The semiconductor device of claim 1, wherein at least a part of the second spacer overlaps with the direct contact in a third direction, which intersects an upper surface of the substrate.

12. A semiconductor device comprising:
    a substrate including first and second regions, which are arranged along a first direction, and an active region in the first region;
    a first conductive pattern extending in the first direction on the first region;
    a second conductive pattern extending in the first direction on the first region, wherein the second conductive pattern is spaced apart from the first conductive pattern in a second direction intersecting the first direction;
    a first spacer disposed on an end of the second conductive pattern facing the second region;
    a second spacer extending between the first conductive pattern and the second conductive pattern along a sidewall of the first conductive pattern and a sidewall of the second conductive pattern;
    a first direct contact connecting the first conductive pattern and a first portion of the active region;
    a capacitor connected to a second portion of the active region;
    a word line extending in the second direction across the active region between the first portion of the active region and the second portion of the active region; and
    a second direct contact connected to the first conductive pattern, on an end of the first conductive pattern facing the second region,
    wherein a distance between the first conductive pattern and the second region is smaller than a distance between the second conductive pattern and the second region, and
    at least a part of the second spacer overlaps with the second direct contact in the second direction.

13. The semiconductor device of claim 12 further comprising an insulation structure including a flat portion, which is disposed on the second region, and a protruding portion, which protrudes from a sidewall of the flat portion in the first direction,
    wherein the first spacer is disposed on an end of the protruding portion facing the second conductive pattern, and
    the second spacer further extends along the sidewall of the flat portion and a sidewall of the protruding portion facing the first conductive pattern.

14. The semiconductor device of claim 12, wherein the second spacer includes a plurality of sub-spacers, which have different materials from each other.

15. The semiconductor device of claim 12, further comprising a wire extending from the second region and connected to a top surface of the second direct contact.

16. The semiconductor device of claim 15, further comprising a sense amplifier on the second region,
wherein the wire electrically connects the second direct contact with the sense amplifier.

17. The semiconductor device of claim 12, wherein the first portion of the active region and the second portion of the active region are arranged along a third direction, which is different from the first and the second direction.

18. The semiconductor device of claim 17, wherein the first portion of the active region is a center of the active region, and
the second portion of the active region is an end of the active region in the third direction.

19. The semiconductor device of claim 12, further comprising:
a buried contact in direct contact with the second portion of the active region, between the first conductive pattern and the second conductive pattern; and
a landing pad electrically connecting the buried contact and the capacitor.

20. A semiconductor device comprising:
a substrate including first and second regions, which are arranged along a first direction, and an active region in the first region;
a first conductive pattern extending in the first direction on the first region;
a second conductive pattern extending in the first direction on the first region, wherein the second conductive pattern is spaced apart from the first conductive pattern in a second direction intersecting the first direction;
a first spacer disposed on an end of the second conductive pattern facing the second region;
a second spacer extending between the first conductive pattern and the second conductive pattern along a sidewall of the first conductive pattern, a sidewall of the second conductive pattern, and a boundary between the first and second regions;
a first direct contact electrically connecting the first conductive pattern and a first portion of the active region;
a capacitor electrically connected to a second portion of the active region;
a word line extending in the second direction across the active region between the first portion of the active region and the second portion of the active region; and
a second direct contact connected to the first conductive pattern, on an end of the first conductive pattern facing the second region,
wherein a distance between the first conductive pattern and the second region is smaller than a distance between the second conductive pattern and the second region, and
at least a part of the second spacer overlaps with the second direct contact in a third direction, which intersects an upper surface of the substrate.

* * * * *